United States Patent
Yen

(10) Patent No.: US 9,337,075 B2
(45) Date of Patent: May 10, 2016

(54) CHEMICAL MECHANICAL POLISHING FIXTURE HAVING LATERAL PERFORATION STRUCTURES

(71) Applicant: KAI FUNG TECHNOLOGY CO., LTD., Hsinchu (TW)

(72) Inventor: Hui-Chen Yen, Hsinchu (TW)

(73) Assignee: KAI FUNG TECHNOLOGY CO., LTD., Hsinchu (TW)

( * ) Notice: Subject to any disclaimer, the term of this patent is extended or adjusted under 35 U.S.C. 154(b) by 147 days.

(21) Appl. No.: 14/197,348

(22) Filed: Mar. 5, 2014

(65) Prior Publication Data

US 2014/0342643 A1    Nov. 20, 2014

(30) Foreign Application Priority Data

May 17, 2013   (TW) .............................. 102209298 U

(51) Int. Cl.
*B24B 37/32* (2012.01)
*H01L 21/687* (2006.01)

(52) U.S. Cl.
CPC .......... *H01L 21/68721* (2013.01); *B24B 37/32* (2013.01)

(58) Field of Classification Search
CPC .. B24B 37/32; H01L 21/68721; H01L 21/687

USPC .......... 451/398, 388, 287, 288, 289, 290, 365
See application file for complete search history.

(56) References Cited

U.S. PATENT DOCUMENTS

| 2010/0041323 | A1* | 2/2010 | Burns | ................... | B24B 37/32 |
| | | | | | 451/398 |
| 2013/0324017 | A1* | 12/2013 | Rahmathullah | ......... | B24B 37/32 |
| | | | | | 451/398 |
| 2014/0287662 | A1* | 9/2014 | Rahmathullah | ......... | B24B 37/32 |
| | | | | | 451/398 |

* cited by examiner

*Primary Examiner* — Robert Rose
(74) *Attorney, Agent, or Firm* — Rabin & Berdo, P.C.

(57) ABSTRACT

A chemical mechanical polishing fixture having lateral perforation structures includes: a holder and a retaining ring. The holder includes: an annular substrate, a plurality of third holes and a plurality of lateral perforation structures. The annular substrate has a first joint surface, an outer periphery and an inner periphery. The third holes are annularly arranged on the first joint surface, and each third hole includes a first inner thread structure for individually providing a screw to be locked to a semiconductor machine. The lateral perforation structures penetrate from the outer periphery to the inner periphery of the annular substrate, where the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above.

22 Claims, 29 Drawing Sheets

CHEMICAL MECHANICAL POLISHING FIXTURE HAVING LATERAL PERFORATION STRUCTURES

CROSS-REFERENCES TO RELATED APPLICATIONS

This non-provisional application claims priority under 35 U.S.C. §119(a) on Patent Application No. 102209298 filed in Taiwan, R.O.C. on 2013 May 17, the entire contents of which are hereby incorporated by reference.

BACKGROUND

1. Technical Field

The present creation relates to a wafer fixture, and more particularly, to a chemical mechanical polishing fixture having a rubber ring.

2. Related Art

In a semiconductor manufacturing process, a wafer fixture is an indispensable basic tool applied to the carrying of a wafer in a wafer machining process to facilitate chemical polishing treatment of the wafer in the manufacturing process.

A conventional wafer fixture shown in FIG. 1 is a standard wafer fixture supplied by a general semiconductor device factory and includes a holder 10 and a retaining ring 20. The holder 10 is generally made of stainless steel (SUS), and is disposed on a semiconductor device; the retaining ring 20 is generally made of high-order plastic materials and used for carrying a wafer. Such a wafer fixture uses an adhesive to bond the retaining ring 20 to the holder 10, and as a bonding surface 11 is a flat surface, the retaining ring 20 and the holder 10 are easily detached due to failure of the adhesive.

In addition, chemical polishing treatment generally requires radial groove cutting at the bottom of the holder 10 when a polishing slurry is imported to facilitate import of the polishing slurry.

Besides, semiconductor devices have been continuously developed toward a larger wafer size, the current mainstream is 12-inch wafer semiconductor devices, and 18-inch wafer semiconductor devices are to come in the future. With such development demands, as for requirements for a chemical polishing fixture, a chemical polishing fixture is expected to be light in weight, easy to assemble, and easy to repair, so as to reduce equipment load and wear of wafer platform polishing. Therefore, how to achieve the above objective becomes an important technical development direction of the chemical polishing fixture.

SUMMARY

In view of the problems in the prior art, the present creation provides a chemical mechanical polishing fixture having lateral perforation structures, which can reduce the weight of a chemical polishing fixture by providing the chemical polishing fixture with lateral openings of larger sizes, so that the chemical polishing fixture have the technical effect of being applicable to different wafer sizes in spite of a same design.

The chemical mechanical polishing fixture having lateral perforation structures according to the present creation includes a holder, a retaining ring and a plurality of bushing screws. The holder includes: an annular substrate, a plurality of first holes and a plurality of lateral perforation structures. The annular substrate has a first joint surface, an outer periphery and an inner periphery. The first holes are annularly arranged on the first joint surface, and each first hole includes a first inner thread structure. The lateral perforation structures penetrate from the outer periphery to the inner periphery of the annular substrate, and the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above. The retaining ring has a second joint surface and a plurality of second holes, where the second holes are annularly arranged on the second joint surface, and each second hole corresponds to one first hole. The bushing screw has a screw head, a hollow structure and a screw rod, where an inner wall surface of the screw rod has a second inner thread structure, an outer wall surface of the screw rod has an outer thread structure, each bushing screw penetrates the second holes of the retaining ring and the first holes of the holder, and then is locked to the first inner thread structure via the outer thread structure to fix the holder and the retaining ring, so that the first joint surface and the second joint surface are joined closely, and the second inner thread structure is used for locking the chemical mechanical polishing fixture having lateral perforation structures to a semiconductor machine individually with a setscrew.

The present creation further provides a chemical mechanical polishing fixture having lateral perforation structures, including: a holder and a plurality of bushing screws. The holder includes: an annular substrate, a plurality of third holes and a plurality of lateral perforation structures. The annular substrate has a first joint surface, an outer periphery and an inner periphery. The third holes are annularly arranged on the first joint surface, and each third hole includes a first inner thread structure. The lateral perforation structures penetrate from the outer periphery to the inner periphery of the annular substrate, and the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above. The bushing screw has a screw head, a hollow structure and a screw rod, where an inner wall surface of the screw rod has a second inner thread structure, an outer wall surface of the screw rod has an outer thread structure, each bushing screw penetrates the third holes of the holder, and then is locked to the first inner thread structure via the outer thread structure to be fixed to the holder, and the second inner thread structure is used for locking the first joint surface to a semiconductor machine by the chemical mechanical polishing fixture having lateral perforation structures individually with a setscrew.

The present creation further provides a chemical mechanical polishing fixture having lateral perforation structures, including: a holder and a retaining ring. The holder includes: an annular substrate, a plurality of third holes and a plurality of lateral perforation structures. The annular substrate has a first joint surface, an outer periphery and an inner periphery. The third holes are annularly arranged on the first joint surface, and each third hole includes a first inner thread structure for individually providing a screw to be locked to a semiconductor machine. The lateral perforation structures penetrate from the outer periphery to the inner periphery of the annular substrate, and the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above.

The present creation further provides a chemical mechanical polishing fixture having lateral perforation structures, including: a holder and a retaining ring. The holder includes:

an annular substrate, a plurality of bumps and a plurality of lateral perforation structures. The annular substrate has a first joint surface, an outer periphery and an inner periphery. The bumps are annularly arranged on the first joint surface, and each bump includes: a first engagement surface, which is a plane extending radially along the annular substrate, a root portion of the first engagement surface inclining towards an outer side of the bump to form a barb structure. The lateral perforation structures penetrate from the outer periphery to the inner periphery of the annular substrate, and the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above. The retaining ring has a second joint surface and a plurality of first grooves, where the first grooves are annularly arranged on the second joint surface, and each first groove includes: a second engagement surface, which is a plane extending radially along the retaining ring, a root portion of the second engagement surface inclining towards the second joint surface to form a barb structure. The holder and the retaining ring are axially aligned, so that the first joint surface is aligned with the second joint surface, the bumps are aligned with the first grooves, and the holder and the retaining ring respectively reversely rotate along a circumferential direction to engage the first engagement surface of the bump with the second engagement surface of the first groove.

The present creation further provides a chemical mechanical polishing fixture having lateral perforation structures, including: a retaining ring and a holder. The retaining ring includes: an annular substrate and a plurality of bumps. The annular substrate has a first joint surface. The bumps are annularly arranged on the first joint surface, and each bump includes: a first engagement surface, which is a plane extending radially along the annular substrate, a root portion of the first engagement surface inclining towards an outer side of the bump to form a barb structure. The holder has an annular structure, a second joint surface and a plurality of first grooves, where the annular structure has an outer periphery and an inner periphery, the first grooves are annularly arranged on the second joint surface, and each first groove includes: a second engagement surface, which is a plane extending radially along the holder, a root portion of the second engagement surface inclining towards the second joint surface to form a barb structure. Lateral perforation structures penetrate from the outer periphery to the inner periphery of the annular structure, and the lateral perforations are selected from: a converse U-shaped cube structure, an converse U-shaped cube structure, a cuboid structure, a cylinder structure, an elliptic cylinder structure, a flat cuboid structure or a hybrid structure of at least one cuboid structure and the above. The holder and the retaining ring are axially aligned, so that the first joint surface is aligned with the second joint surface, the bumps are aligned with the first grooves, and the holder and the retaining ring respectively reversely rotate along a circumferential direction to engage the first engagement surface of the bump with the second engagement surface of the first groove.

DETAILED DESCRIPTION

Figure 1:
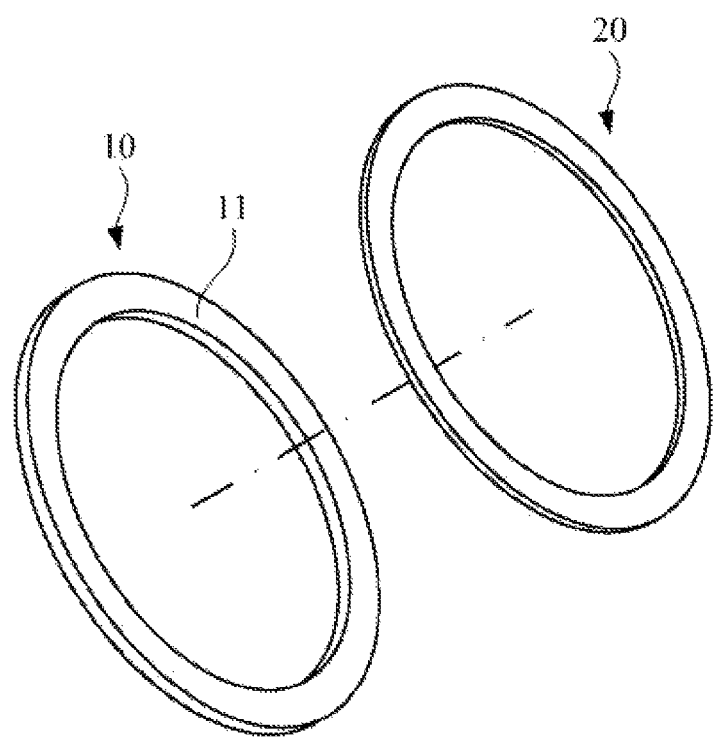
FIG. 1 is a schematic view of a conventional wafer fixture.

Referring to FIG. 2A to FIG. 2F, FIG. 2A to FIG. 2F are a front view, a partially enlarged view of an area 2 and a schematic sectional view in one embodiment and other three embodiments of the partially enlarged view of the area 2 of a chemical mechanical polishing fixture according to the present creation. The chemical mechanical polishing fixture according to the present creation includes: a holder 200, a retaining ring 100, a plurality of bushing screws 300 and lateral perforations 500, 502, 503 and 504. The lateral perforation 500 is configured perpendicular to the outer periphery of the holder 200; the lateral perforation 502 is configured not perpendicular to the outer periphery of the holder 200; the lateral perforation 503 is configured not perpendicular to the outer periphery of the holder 200, and expands from the outside to the inside; the lateral perforation 504 is configured not perpendicular to the outer periphery of the holder 200, and expands from the inside to the outside. Referring to FIG. 3A to FIG. 3F at the same time, FIG. 3A to FIG. 3F are a sectional exploded view, a sectional combined view and a sectional three-dimensional view of elements in an area 2 along a section A-A, an enlarged view of a part 3, and an enlarged view of a part 4 in the embodiments of FIG. 2B and FIG. 2C, which are embodiments that a bushing screw 300 uses a screw head with a flat-head structure.

Figure 2A:
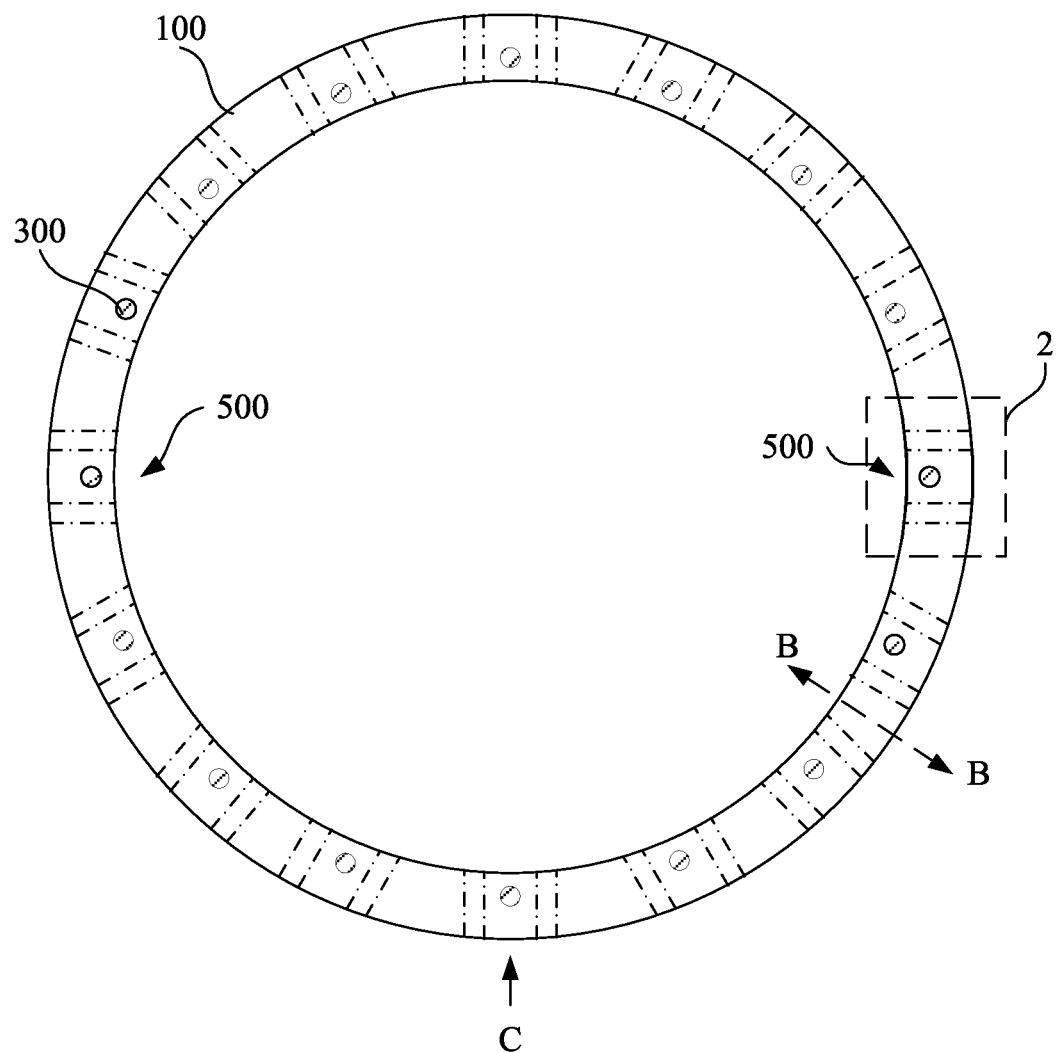
FIG. 2A, FIG. 2B, and FIG. 2C are a front view, a partially enlarged view of an area 2, and a schematic side view seen from C in one embodiment of a chemical mechanical polishing fixture according to the present creation.

In FIG. 2A, a plurality of bushing screws 300 is included and is locked to the retaining ring 100. The bushing screw 300 has a hollow structure 310 (FIG. 2B) and can be locked to a semiconductor machine (not shown) with a setscrew (not shown).

Figure 3A:
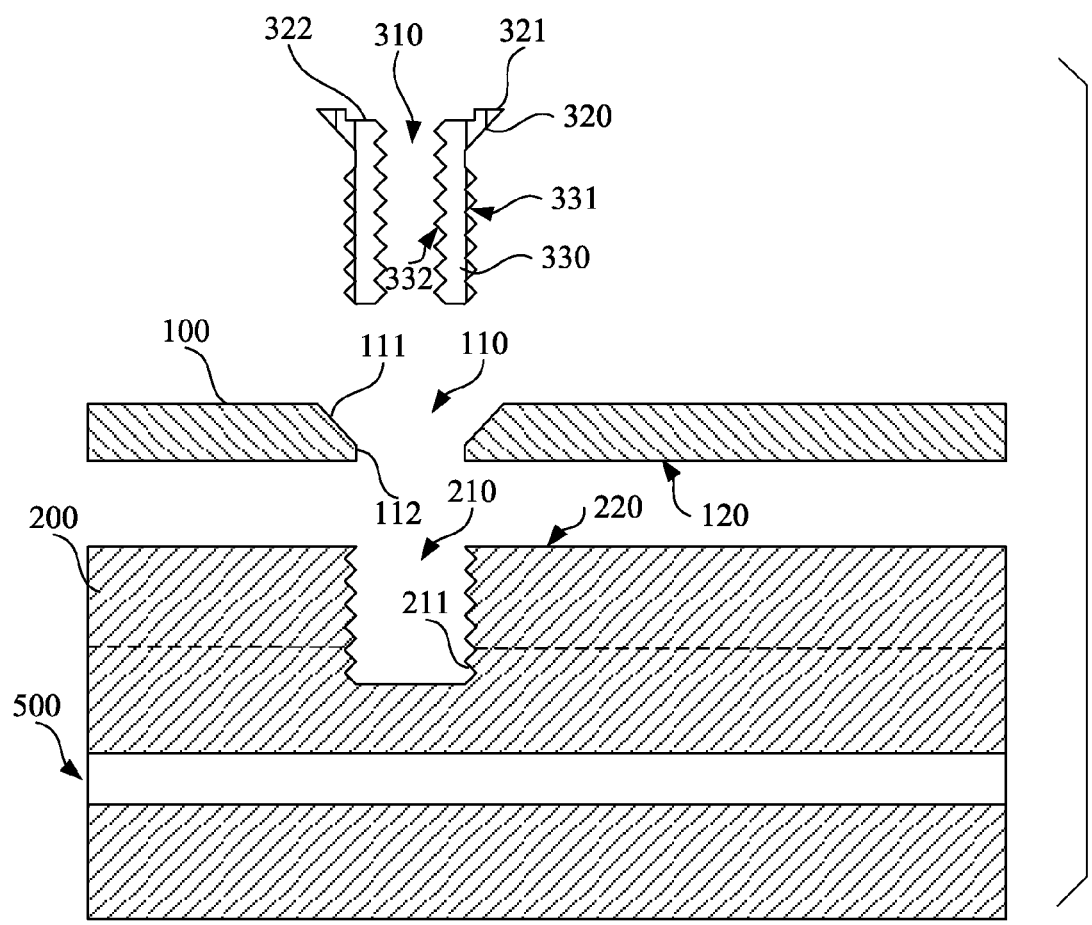
FIG. 3A is a sectional exploded view of elements in the area 2 along a section A-A in the embodiment of FIG. 2B, which is an embodiment that a bushing screw 300 uses a screw head with a flat-head structure.

Referring to FIG. 2A and FIG. 3A, a first joint surface 220 of the holder 200 is annular, and may be made of stainless steel. The holder 200 includes: an annular substrate having a first joint surface 220, and a plurality of first holes 210. The first holes 210 are annularly arranged on the first joint surface 220, and each first hole 210 includes a first inner thread structure 211. The retaining ring 100 has a second joint surface 120 and a plurality of second holes 110, where the second holes 110 are annularly arranged on the second joint surface 120, and each second hole 110 corresponds to one first hole 210. The bushing screw 300 has a screw head 320, a hollow structure 310 and a screw rod 330. An inner wall surface of the screw rod 330 of the bushing screw 300 has a second inner thread structure 332, and an outer wall surface of the screw rod 330 has an outer thread structure 331. Each bushing screw 330 can penetrate the second holes 110 of the retaining ring 100 and the first holes 210 of the holder 200, and then is locked to the first inner thread structure 211 via the outer thread structure 331 to fix the holder 200 and the retaining ring 100, so that the first joint surface 220 and the second joint surface 120 are joined closely. The second inner thread structure 332 is used for locking the chemical mechanical polishing fixture to a semiconductor machine (not shown) individually with a setscrew (not shown).

The first joint surface 220 of the holder 200 is annular, and may be made of stainless steel (SUS). The second joint surface 120 of the retaining ring 100 is also annular, and may be made of high-order plastic materials. Basically, the first joint surface 220 and the second joint surface 120 are designed correspondingly, and the first joint surface 220 and the second joint surface 120 can be joined closely with the bushing screws 300 synchronously penetrating the first holes 210 and the second holes 110 and performing locking.

In terms of another embodiment, the holder 200 is a plastic holder, and the retaining ring 100 is a metal retaining ring.

Referring to FIG. 3A, a top surface 321 of the bushing screw 300 has a hexagonal locking structure 322 for providing a locking tool (hex screwdriver) to perform locking. That is, the locking tool may lock the bushing screw 300 into the first inner thread 211 of the holder 200 through the hexagonal locking structure 322 on the screw head 320 of the bushing screw 300. By pressing the flat-head structure of the screw head 320 in a nut accommodating portion 111 of the second hole 110 of the retaining ring 100, the second joint surface 120 of the retaining ring 100 and the first joint surface 220 of the holder 200 can be joined closely.

In FIG. 3A, in addition to the nut accommodating portion 111, the second hole 110 has a screw rod accommodating portion 112. In other embodiments, the screw rod accommodating portion 112 may be omitted.

Figure 2B:
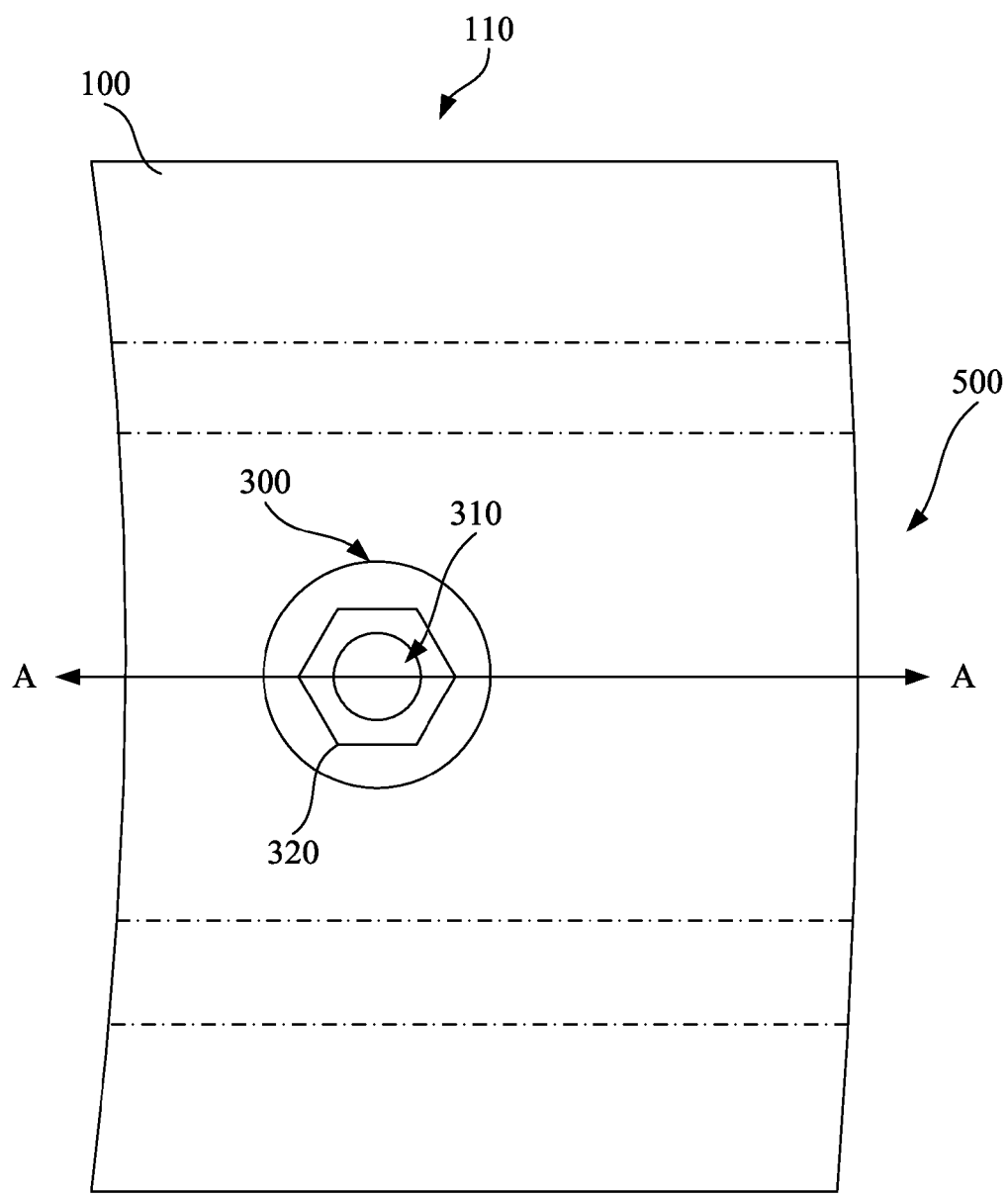
Figure 2C:
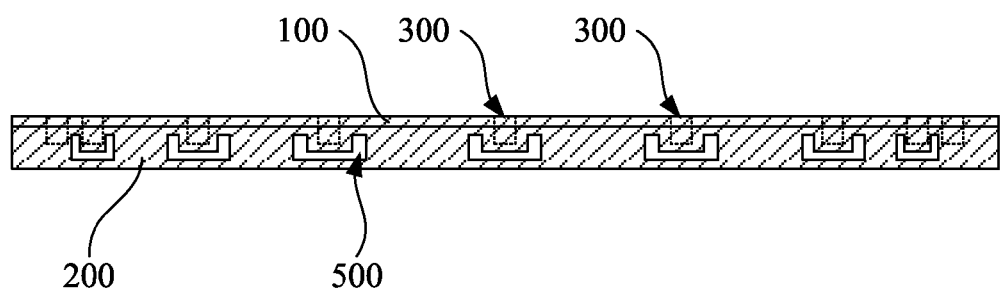
Figure 2D:
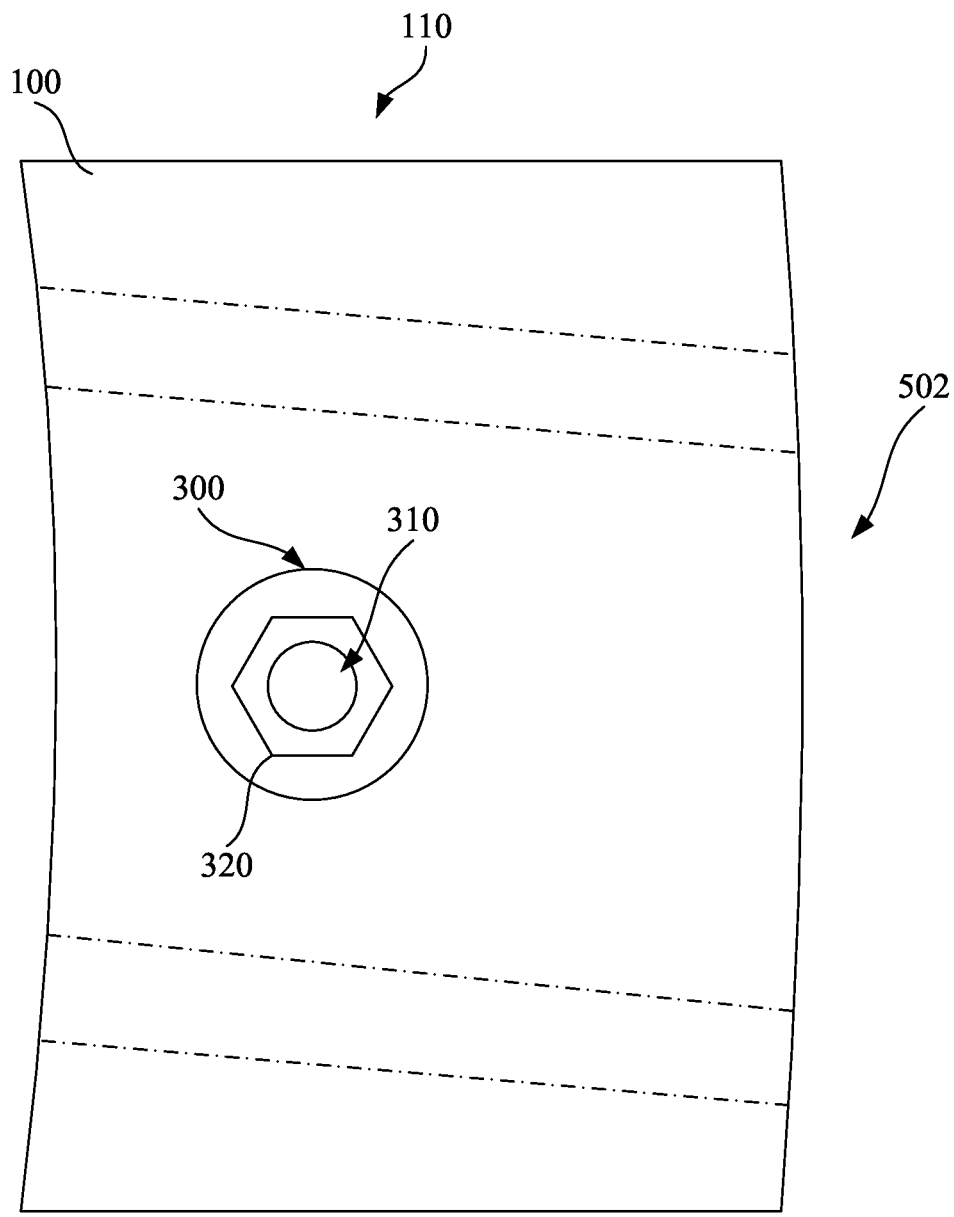
FIG. 2D, FIG. 2E, and FIG. 2F are a front view and a partially enlarged view of an area 2 in one embodiment of a chemical mechanical polishing fixture according to the present creation, which are schematic views of shapes of lateral perforations 502, 503 and 504 respectively.
Figure 3B:
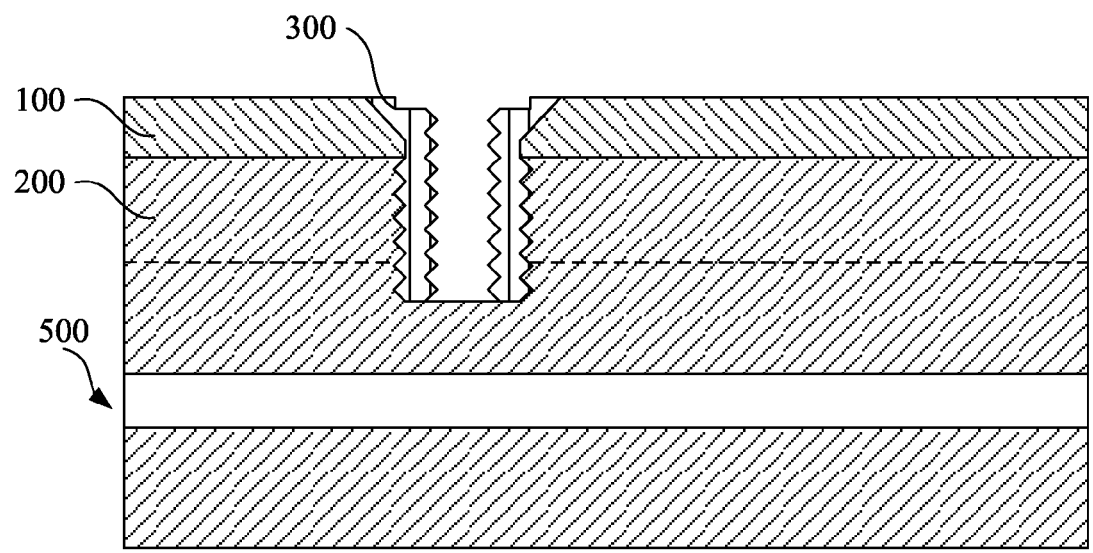
FIG. 3B is one embodiment of a combined view of elements in the area 2 along a section A-A in the embodiment of FIG. 2B.

Next, referring to FIG. 3B, FIG. 3B is a structural view of a lateral perforation along a section B-B in the embodiment of FIG. 2B. In the holder 200, the annular substrate may further include a plurality of lateral perforations 500 disposed between the first holes 210 in a direction perpendicular to an axis of the first hole 210. The lateral perforations 500 penetrate from the outer periphery to the inner periphery of the annular substrate, and the lateral perforations 500 have a converse U-shaped cube structure. In terms of other embodiments, the structure of the lateral perforation 500 also may be: an converse U-shaped cube structure, a cuboid structure, a cylinder structure, an elliptic cylinder structure, a flat cuboid structure or a hybrid structure of at least one cuboid structure and the above. The lateral perforations 500 may provide a chemical liquid required by perfusion of semiconductor fabrication of the chemical mechanical polishing fixture according to the present creation.

Figure 3C:
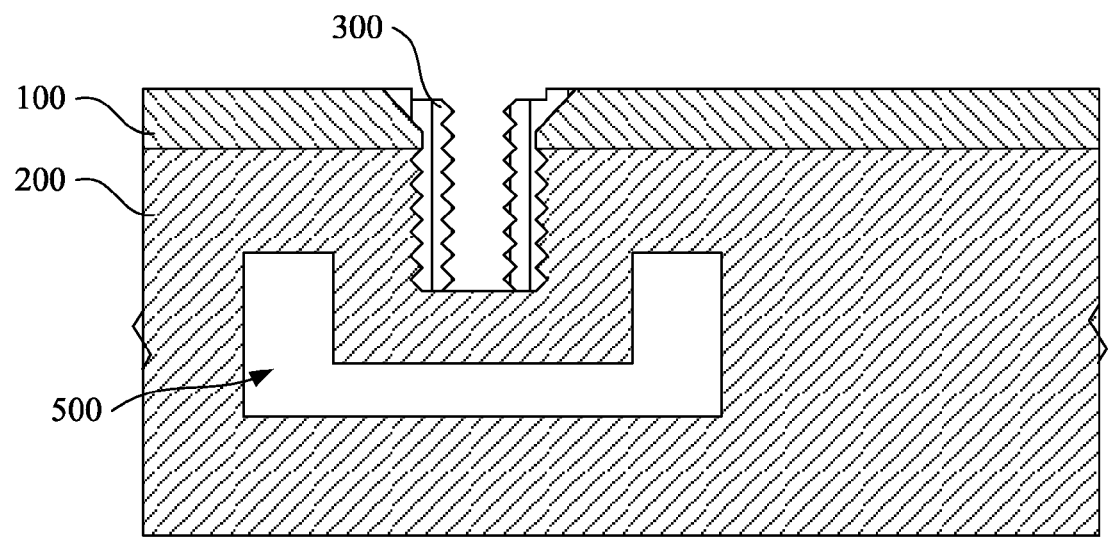
FIG. 3C is a three-dimensional view in the area 2 along a section A-A in the embodiment of FIG. 2B.
Figure 3D:
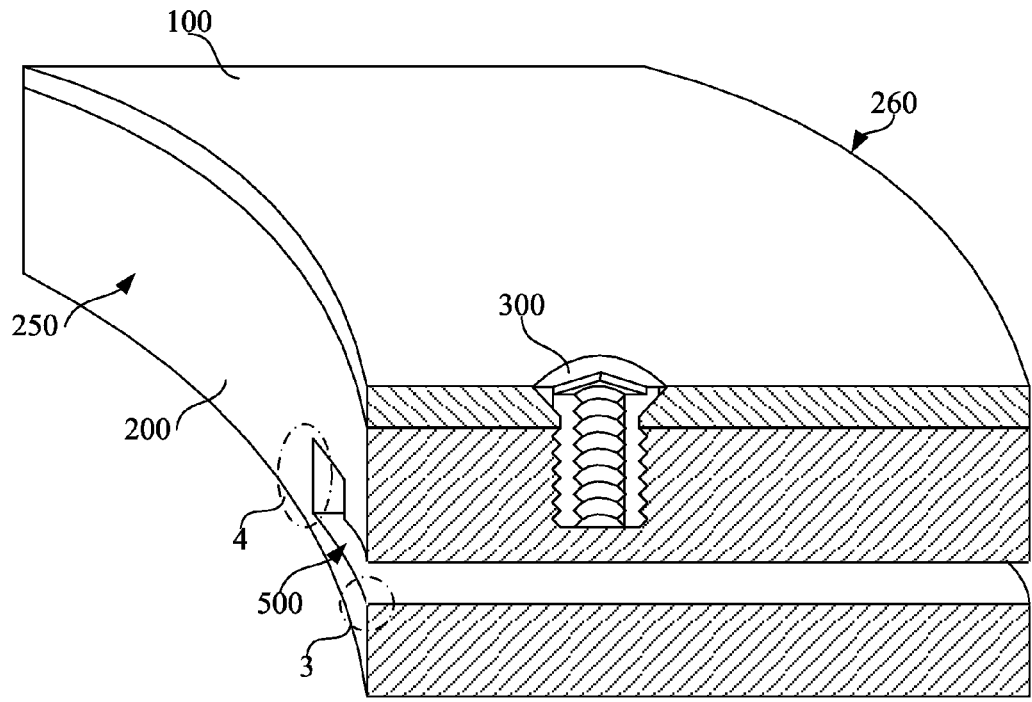
FIG. 3D is a structural view of lateral perforations along a section B-B in the embodiment of FIG. 2B.

Referring to FIG. 3B, FIG. 3C and FIG. 3D at the same time, FIG. 3B, FIG. 3C and FIG. 3D describe that the lateral perforations 500 are formed below the bushing screws 300 and penetrate from an inner periphery 250 to an outer periphery 260 of the holder 200. The converse U-shaped cube structure allows the lower part of the bushing screws 300 to be hollowed out without affecting the strength of the holder 200, and can reduce the metal volume of the holder 200, thereby reducing the weight of the holder 200. By means of the converse U-shaped cube structure, it is unnecessary to worry about that the lateral perforations 500 may affect configuration space of the bushing screws 300 structurally. Other lateral perforation structures also may be configured in manners similar to those in FIG. 3C and FIG. 3D, or, be configured on two sides of the bushing screws 300.

In terms of other structures of the lateral perforations 500, the purpose of reducing the weight of the holder 200 also can be achieved by setting lateral perforations in several faces. Similarly, when the holder 200 uses plastic materials, the lateral perforations 500 also can reduce the weight of the holder 200.

Figure 2E:
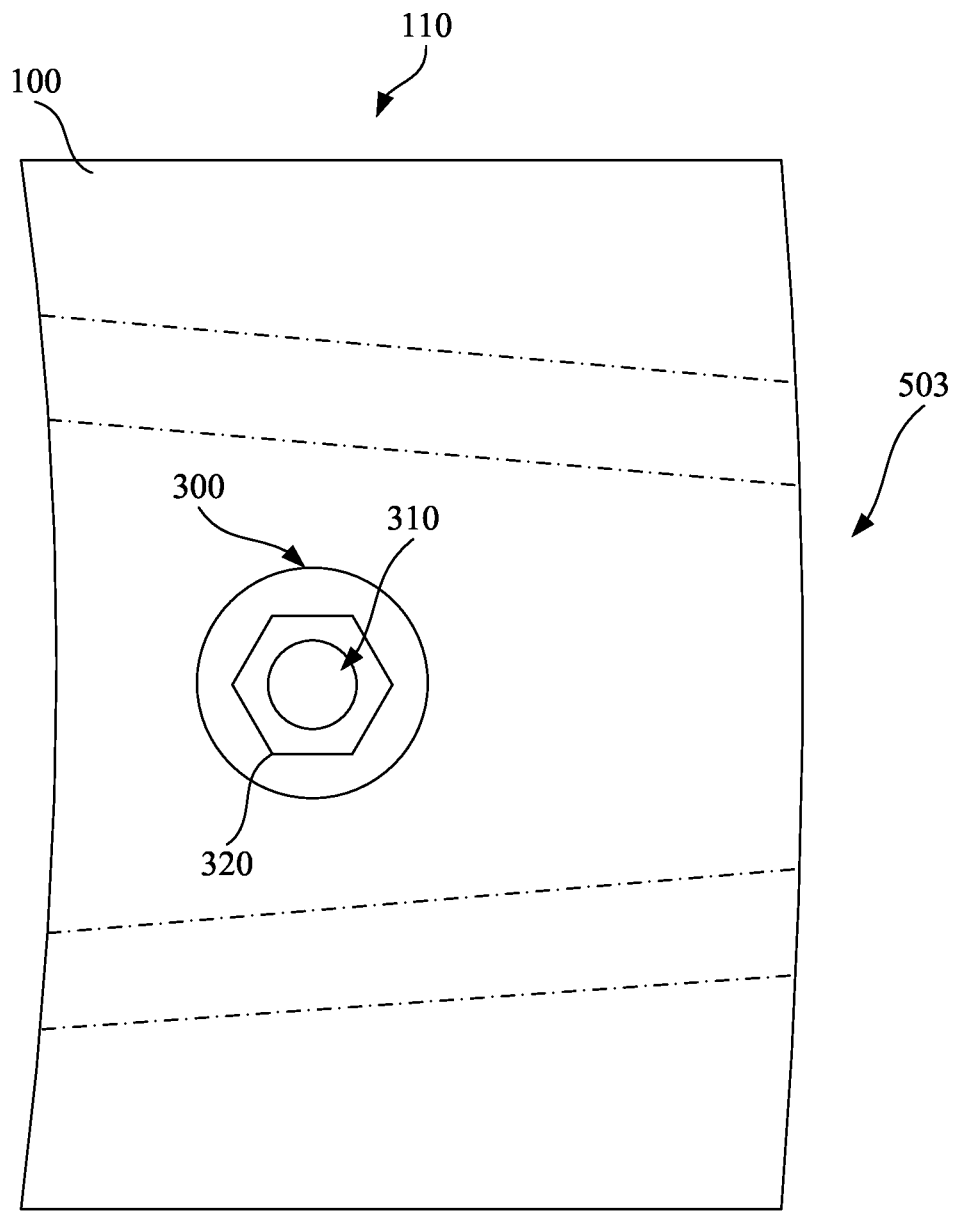
Figure 2F:
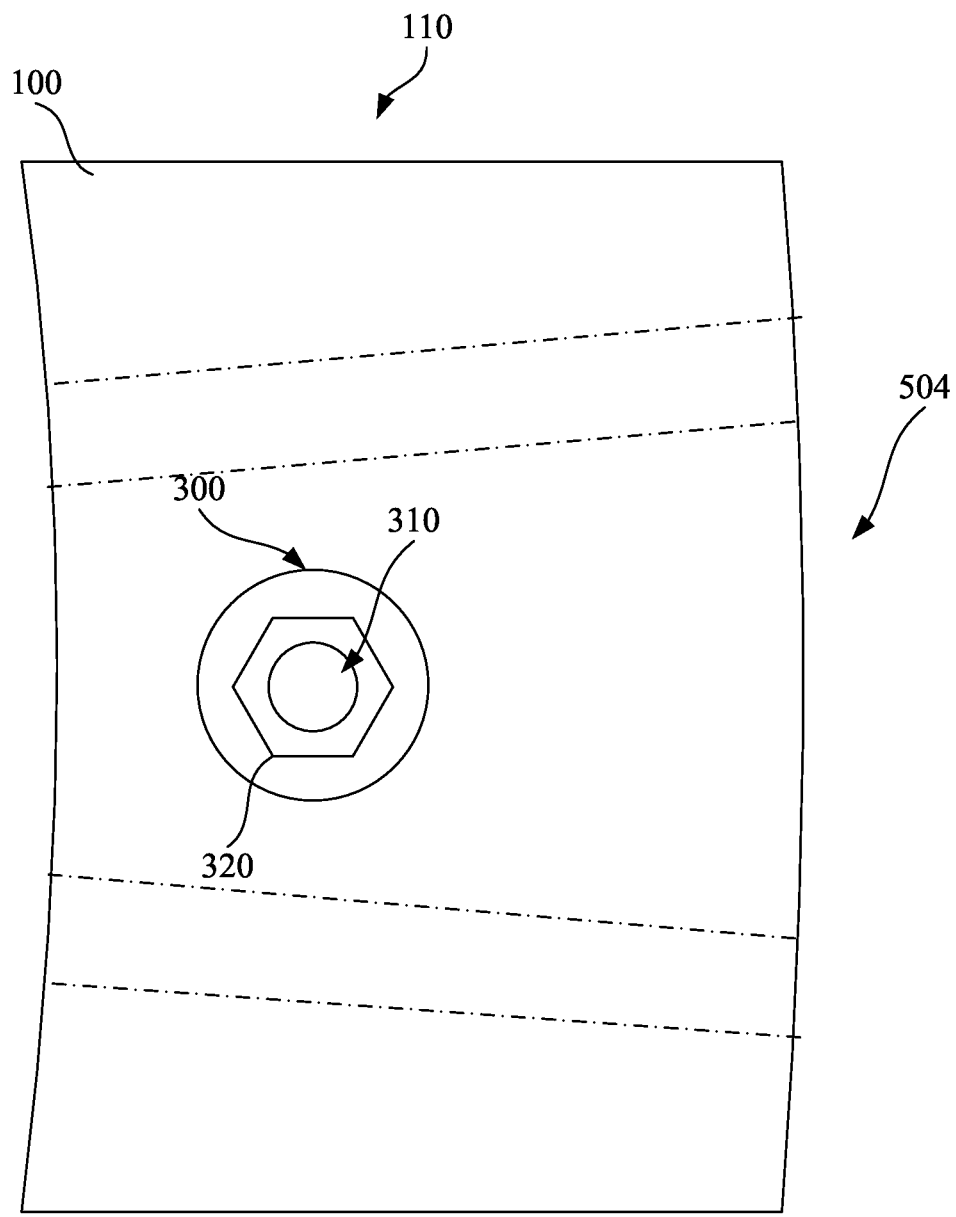

In addition, in FIG. 2B, the lateral perforations 500 are configured in a manner of being perpendicular to the outer periphery and the inner periphery of the holder 200. In terms of other embodiments, lateral perforation structures (to be shown in FIG. 13B) which are oblique (FIG. 2D) or at staggered angles (FIG. 2E and FIG. 2F).

Besides, before the bushing screws 300 are locked, an adhesive layer is applied between the first joint surface 220 of the holder 200 and the second joint surface 120 of the retaining ring 100 to strengthen bonding strength between the holder 200 and the retaining ring 100. After an engagement surface formed by the holder 200 and the retaining ring 100 is adhered through the adhesive layer, a joint structure having high stability and durability can be formed. There are many choices for the adhesive, which are well known to persons skilled in the art and are not repeated herein.

The first joint surface 220 and the second joint surface 120 may have many different designs, and the embodiments in FIG. 3A to FIG. 3D are that shapes of the holder 200 and the retaining ring 100 are the same, that is, the first joint surface 220 and the second joint surface 120 both are annular plane structures.

Figure 3E:
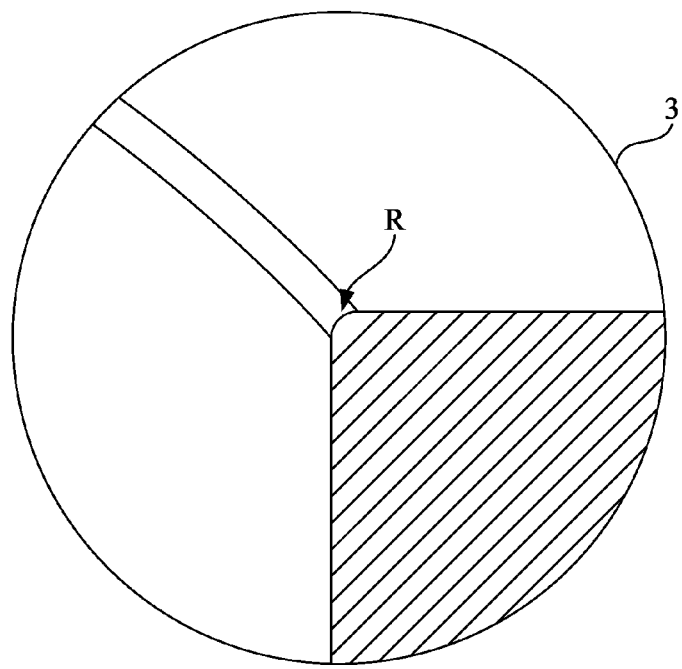
FIG. 3E is a schematic view of an angle R of the area 3 in the embodiment of FIG. 3D.
Figure 3F:
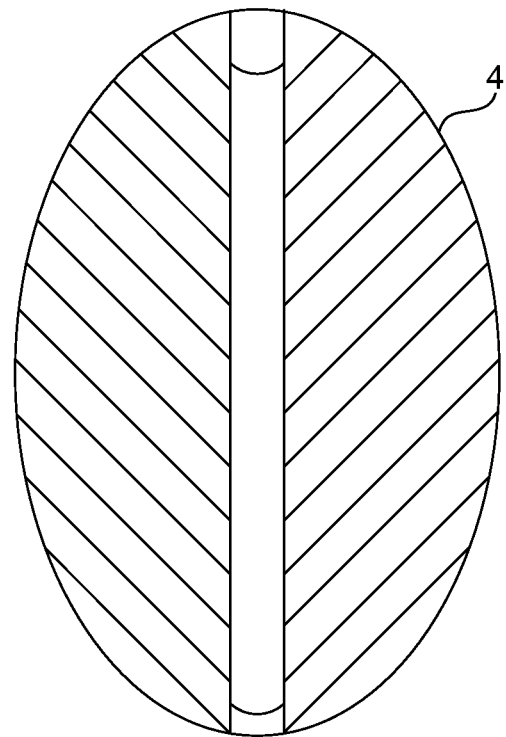
FIG. 3F is a schematic view of an angle R of the area 4 in the embodiment of FIG. 3D.

Next, referring to FIG. 3E and FIG. 3F, in the enlarged views of areas 3 and 4, the structure of the lateral perforation 500 has an angle R (Radius) at a bending position. The angle R may be manufactured in the lateral perforation manufacturing process, may be manufactured by adopting polishing, cutting or other methods, and can prevent a chemical polishing slurry from accumulating during perfusion to increase resistance of following perfusion of the chemical polishing slurry to the lateral perforations 500 to prevent the process from becoming less stable.

Figure 3G:
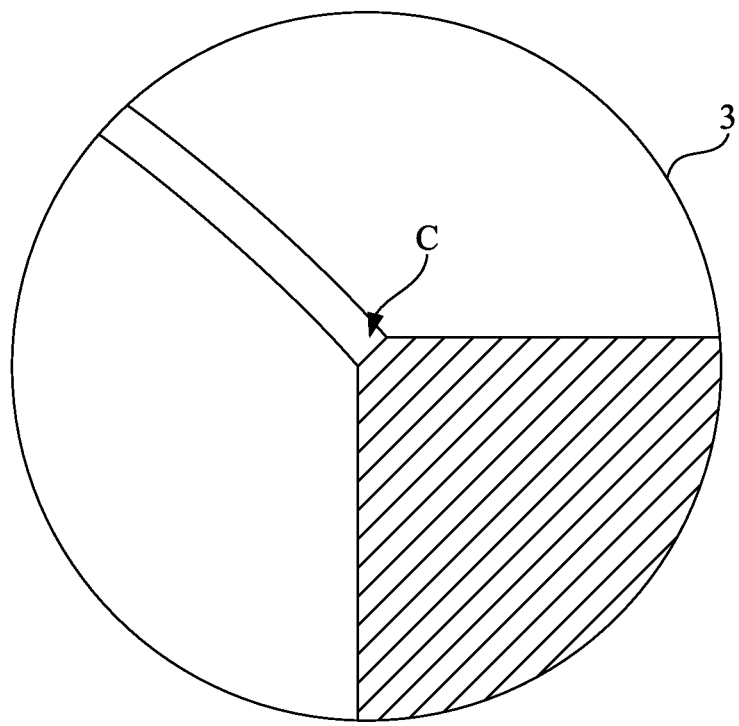
FIG. 3G is a schematic view of an angle C of the area 3 in the embodiment of FIG. 3D.
Figure 3H:
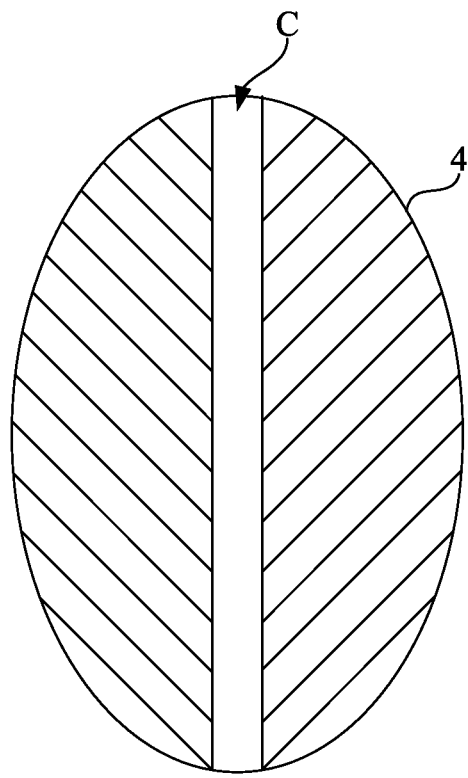
FIG. 3H is a schematic view of an angle C of the area 4 in the embodiment of FIG. 3D.

Next, referring to FIG. 3G and FIG. 3H, in the enlarged views of areas 3 and 4, the structure of the lateral perforation 500 has an angle C (Chamfer) at a bending position. The angle C may be manufactured in the lateral perforation manufacturing process, may be manufactured by adopting polishing, cutting or other methods, and can prevent a chemical polishing slurry from accumulating during perfusion to increase resistance of following perfusion of the chemical polishing slurry to the lateral perforations 500 to prevent the process from becoming less stable.

Figure 3I:
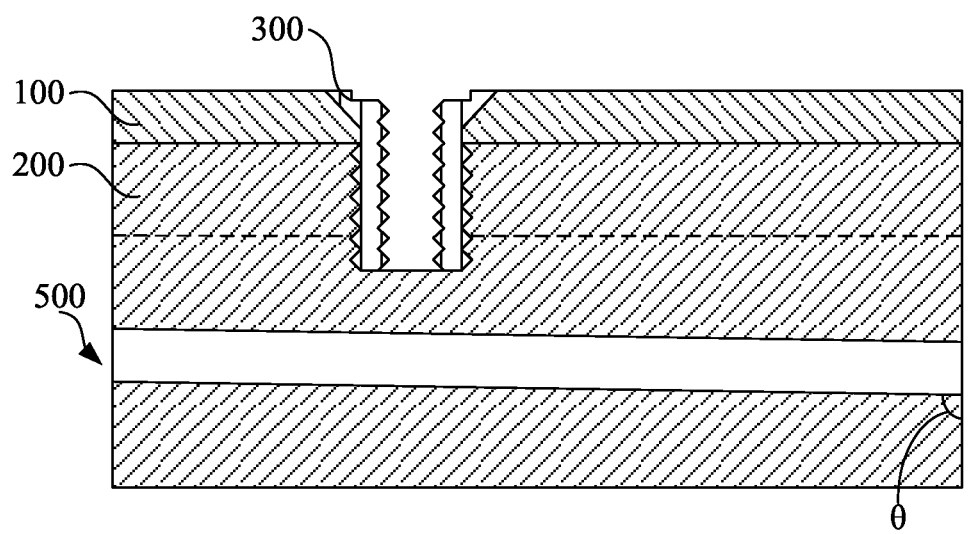
FIG. 3I is a schematic view that a lateral perforation 500 and an outer periphery of a retaining ring are at an inclined angle of θ in the embodiment of FIG. 3B.

Next, referring to FIG. 3I, FIG. 3I is a schematic view that the lateral perforation 500 and the outer periphery of the retaining ring 100 are at an inclined angle of θ in the embodiment of FIG. 3B. In this way, the chemical polishing slurry can be easily perfused. The inclined angle of θ may be between 60 degrees and 120 degrees. In the embodiment of FIG. 3B, the lateral perforation 500 and the outer periphery are perpendicular to each other (90 degrees).

Similar lateral perforation structures may apply to different relative structures of the holder and the retaining ring. The present creation sequentially describes other possible embodiments below.

Figure 4:
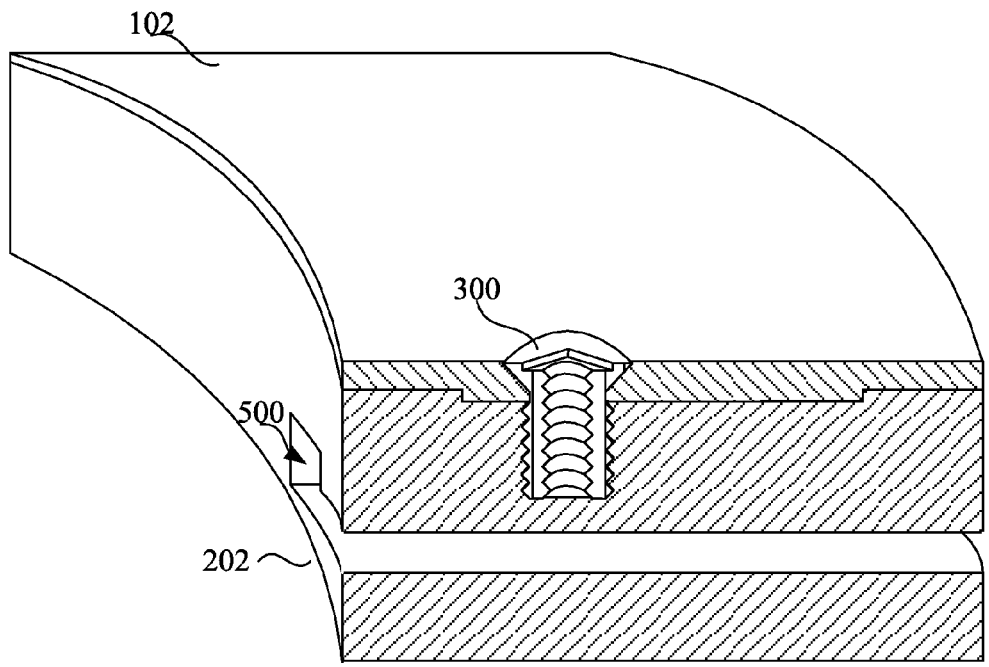
FIG. 4 is another embodiment of a combined view of elements in the area 2 along a section A-A in the embodiment of FIG. 2B.

Referring to FIG. 4, FIG. 4 is a sectional three-dimensional view in one embodiment of the present creation, which is another embodiment of a combined view of elements in the area 2 along a section A-A in the embodiment of FIG. 2B. In this embodiment, the first joint surface of the holder 202 is an annular groove structure, while the second joint surface of the retaining ring 102 is an annular convex structure, so that the first and second joint surfaces can be correspondingly joined closely.

Figure 5:
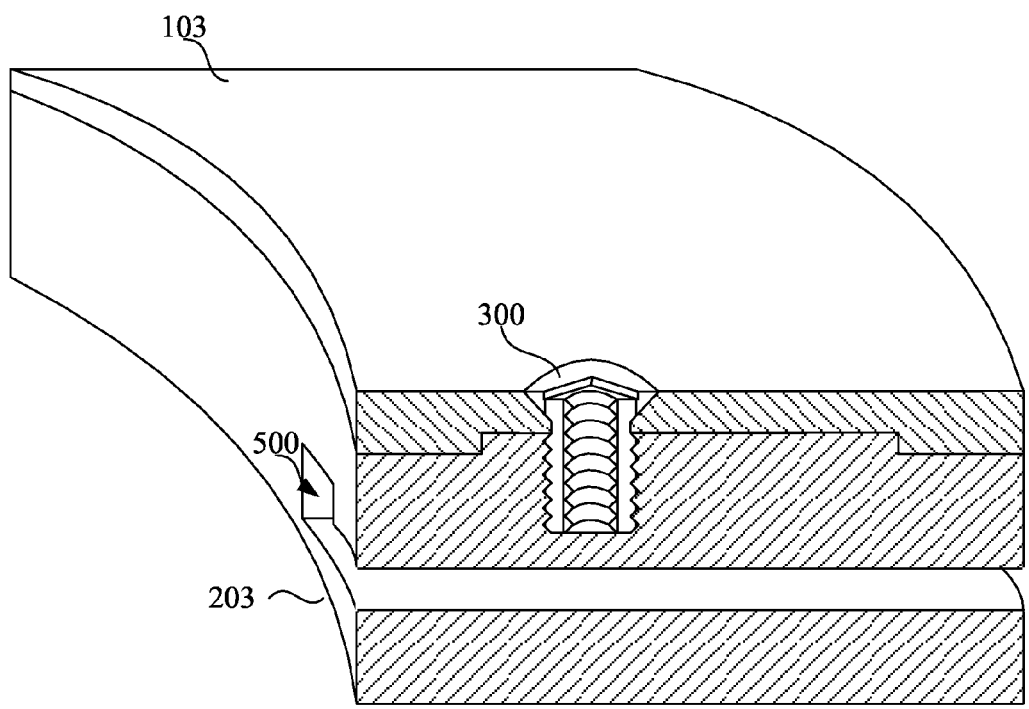
FIG. 5 is a further embodiment of a combined view of elements in the area 2 along a section A-A in the embodiment of FIG. 2B.

Referring to FIG. 5, FIG. 5 is a sectional three-dimensional view in one embodiment of the present creation, which is a further embodiment of a combined view of elements in the area 2 along a section A-A in the embodiment of FIG. 2B. In this embodiment, the first joint surface of the holder 203 is an annular convex structure, while the second joint surface of the retaining ring 103 is an annular groove structure, so that the first and second joint surfaces can be correspondingly joined closely.

Figure 6:
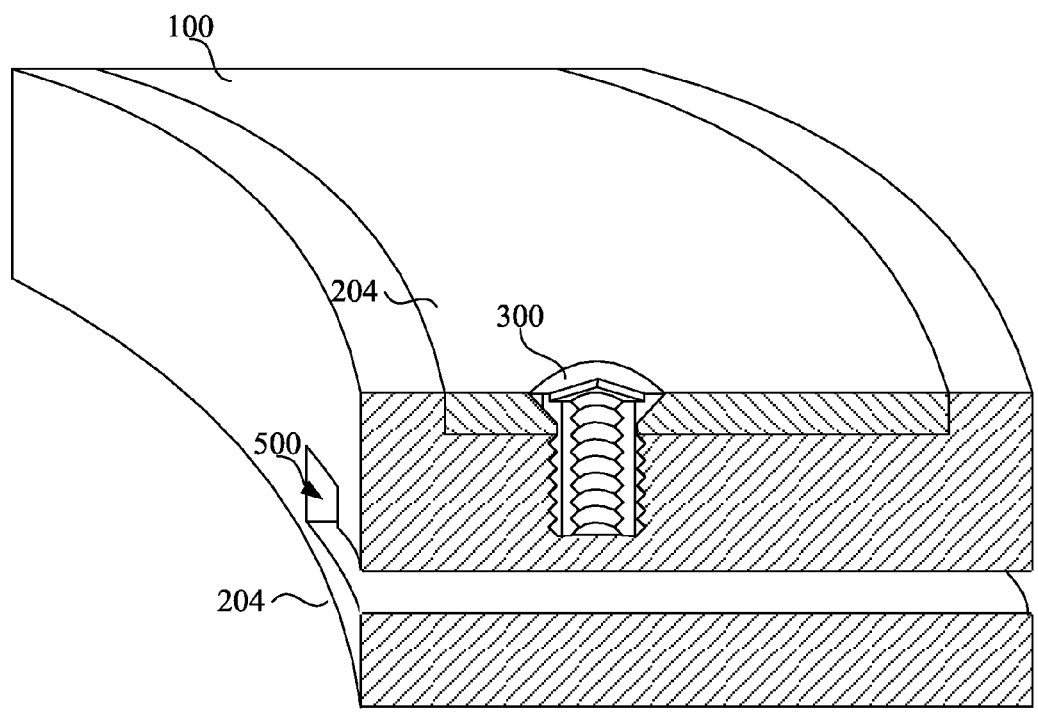
FIG. 6 is yet another embodiment of a combined view of elements in the area 2 along a section A-A in the embodiment of FIG. 2B.

Referring to FIG. 6, FIG. 6 is a sectional three-dimensional view in one embodiment of the present creation, which is yet another embodiment of a combined view of elements in the area 2 along a section A-A in the embodiment of FIG. 2B. In this embodiment, the first joint surface of the holder 204 is an annular convex structure, while the second joint surface of the retaining ring 100 is a planar structure and is covered by the first joint surface, so that the first and second joint surfaces are correspondingly joined closely.

Figure 7:
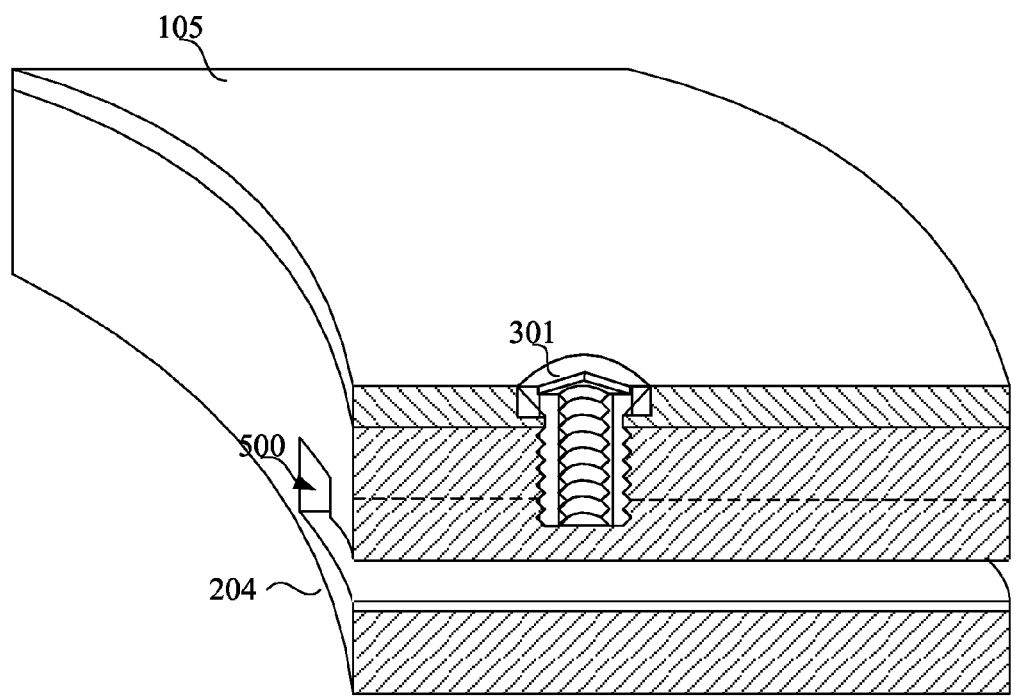
FIG. 7 is another embodiment of a combined view of elements in the area 2 along a section A-A in the embodiment of FIG. 2B.

In addition to different combined surface designs of the holder 200 and the retaining ring 100, the screw head of the bushing screw 300 also may be designed in a different way. For example, the embodiment of FIG. 3D uses the design of a screw head with a flat-head structure. Referring to FIG. 7, FIG. 7 shows an embodiment of a design that the combination of the holder 204 and the retaining ring 105 uses bushing screws 301 with a screw head of a countersunk structure. Because of the use of the design of the screw head of a countersunk structure, a screw head accommodating portion 113 of the retaining ring 105 for correspondingly accommodating the screw head 350 is also changed into the design of the countersunk structure, while the holder 204 is identical with the holder 200. Except the difference in the design of the screw head, that is, the appearance structure after the bushing screws 301 combine the holder 204 with the retaining ring 105, the embodiment of FIG. 7 is basically same as the embodiment of FIG. 3D.

Figure 8:
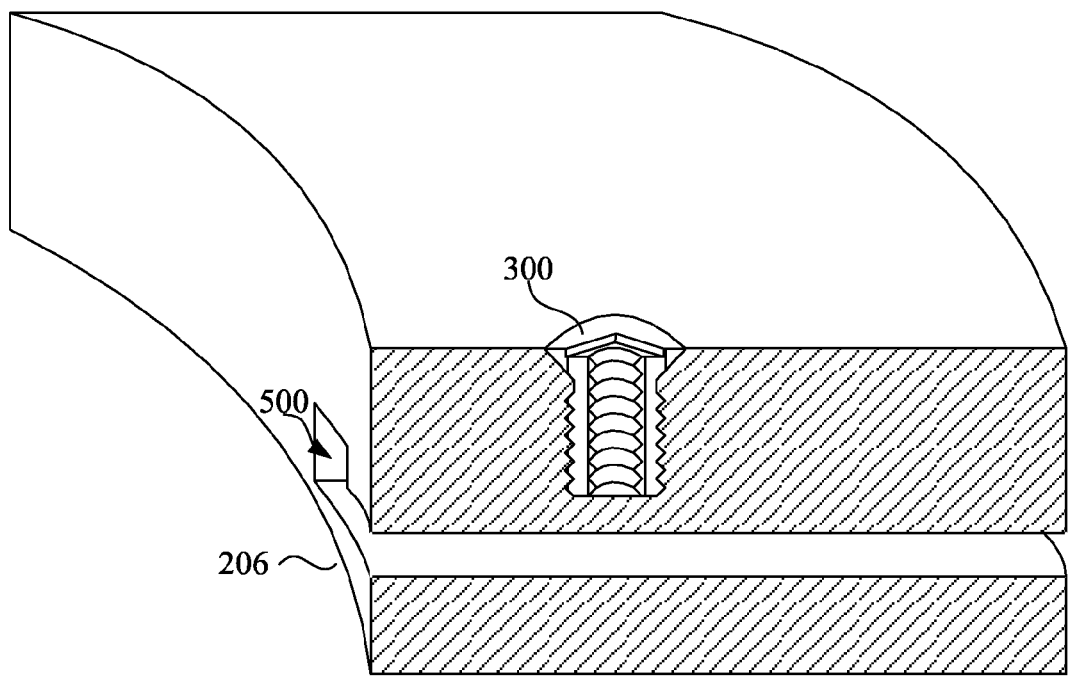
FIG. 8 is a further embodiment of a combined view of elements in the area 2 along a section A-A in the embodiment of FIG. 2B.

In addition, on some particular machines, if a chemical mechanical polishing fixture with lighter weight is required, another embodiment of the present creation is applicable. Referring to FIG. 8, FIG. 8 is a sectional three-dimensional view in one embodiment of the present creation, which is a further embodiment of a combined view of elements in the area 2 along a section A-A in the embodiment of FIG. 2B. This embodiment uses an integrally formed holder 206, that is, the holder 206 made of high-order plastic materials (for example, PPS or PBN).

In the previous different embodiments, the annular diameters of the retaining ring and the holder are same. In other embodiments, the annular diameters of the retaining ring and the holder may be different. In this way, the annular diameter of the holder or the thickness of the holder can be adjusted in the same condition of manufacturing the retaining ring, that is, the chemical polishing retaining ring of the present creation can be applied to applications having different width requirements.

Figure 9A:
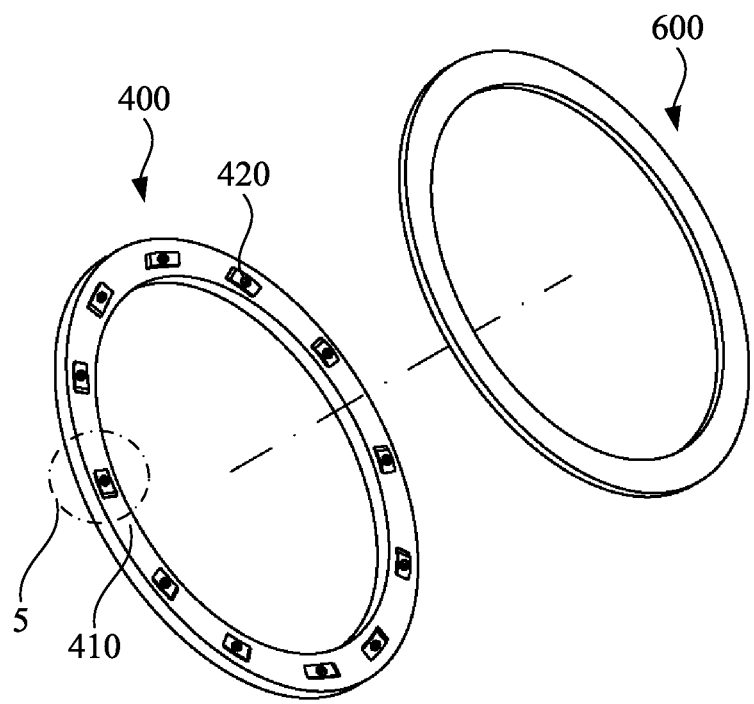
FIG. 9A and FIG. 9B are a structural embodiment of the present creation being applied to another chemical mechanical polishing fixture.
Figure 9B:
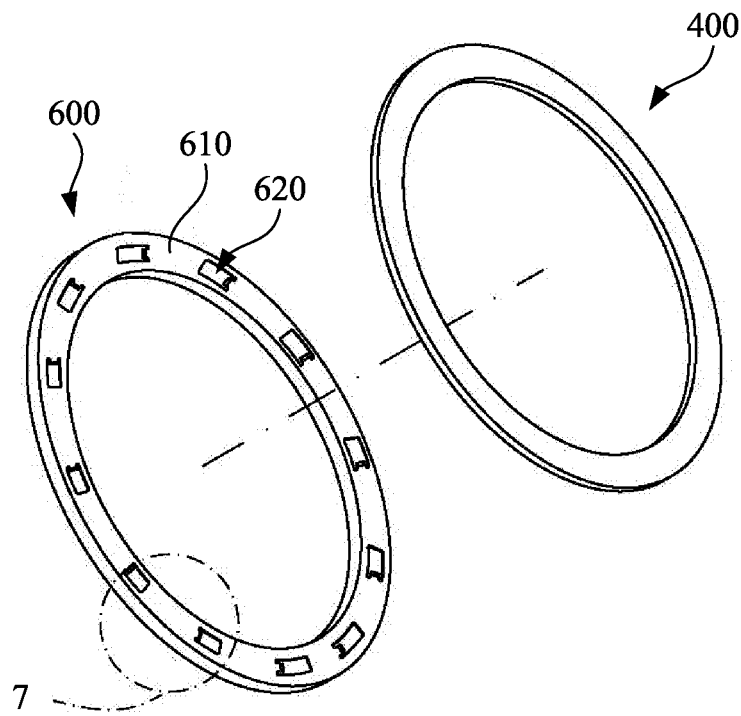

Next, referring to the schematic views of the embodiments of the present creation shown in FIG. 9A and FIG. 9B, the chemical mechanical polishing fixture according to the present creation includes: a holder 400, a retaining ring 600, at least one bump 420 and at least one first groove 620.

The holder 400 has a first joint surface 410, and the first joint surface 410 is annular, and the holder 400 may be made of stainless steel (SUS). The first joint surface 410 is provided with a plurality of bumps 420 annularly arranged, and the bumps 420 also may be made of stainless steel (SUS). The retaining ring 600 has a second joint surface 610 and a plurality of first grooves 620 corresponding to the bumps 420, which may be made of high-order plastic materials, for example, PPS or PBN. The holder 400 and the retaining ring 600 may respectively rotate reversely along a circumferential direction to engage the bumps 420 with the first grooves 620, and closely join the first joint surface 410 with the second joint surface 610. After an engagement surface formed by the holder 400 and the retaining ring 600 is adhered through an adhesive, a joint structure having high stability and durability can be formed. There are many choices for the adhesive, which are well known to persons skilled in the art and are not repeated herein.

Figure 10A:
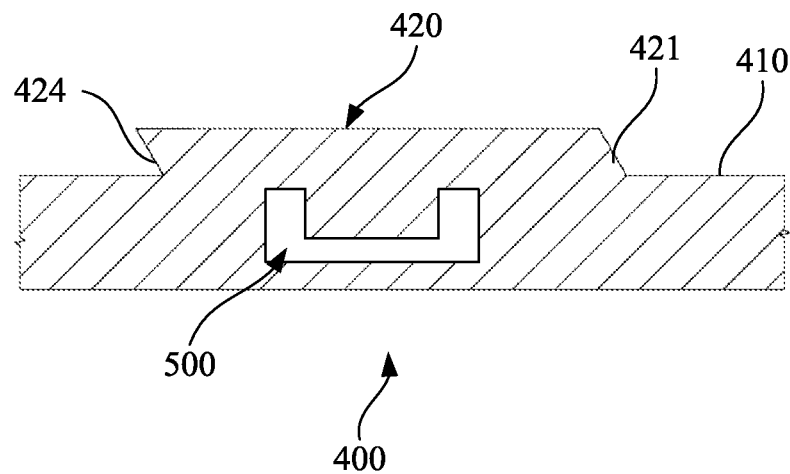
FIG. 10A to FIG. 10C are schematic sectional views of different embodiments of bumps 420 in a holder in the embodiment of FIG. 9A and FIG. 9B according to the present creation.

It can be seen from FIG. 10A that the bumps 420 are integrally formed with an annular substrate of the holder 400.

Figure 10B:
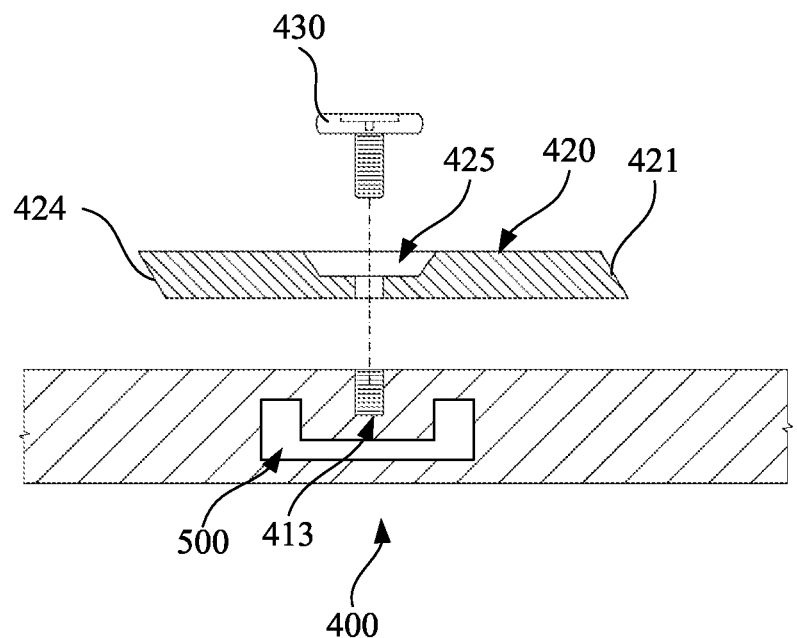

It can be seen from FIG. 10B that a screw 430 locks the bumps 420 to the annular substrate of the holder 400 through a first screw hole 425 and a second screw hole 413.

Figure 10C:
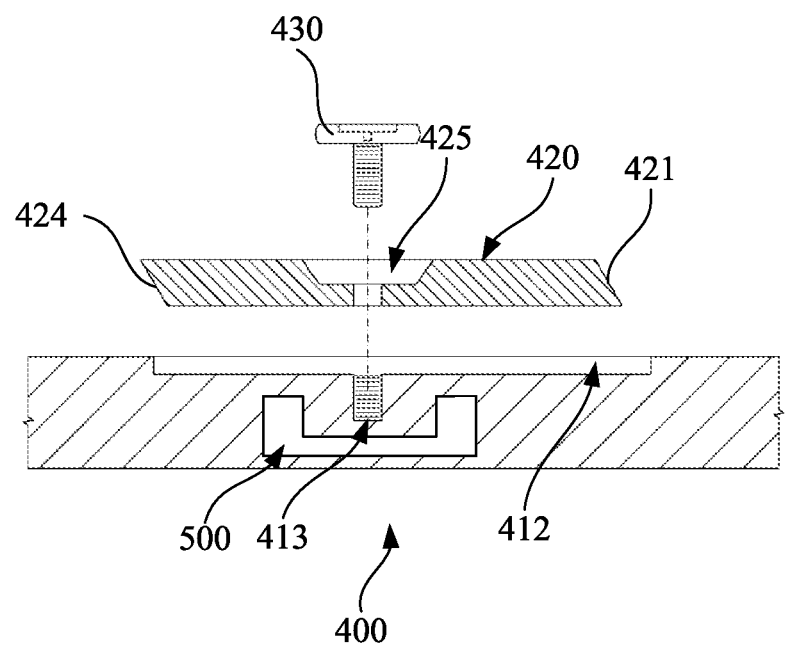

It can be seen from FIG. 10C that the screw 430 locks the bumps 420 to the annular substrate of the holder 400 through the first screw hole 425 and the second screw hole 413. Moreover, the bumps 420 may be placed in a second groove 412 and are then positioned in the second groove 412.

The embodiments of FIG. 10A to FIG. 10C describe that the lateral perforations 500 are formed below the second screw hole 413. The converse U-shaped cube structure allows the lower part of the second screw hole 413 to be hollowed out without affecting the strength of the holder 400, and can reduce the metal volume of the holder 400, thereby reducing the weight of the holder 400. By means of the converse U-shaped cube structure, it is unnecessary to worry about that the lateral perforations 500 may affect configuration space of the second screw hole 413 structurally. Other lateral perforation structures also may be configured in manners similar to those in FIG. 10A to FIG. 10C, or, be configured on two sides of the second screw hole 413.

In terms of another embodiment, when the holder 400 uses plastic materials, the lateral perforations 500 also can reduce the weight of the holder 400.

The bump 420 has a first guide surface 421 and a second guide surface 424. Aligned with the first grooves 620, each first engagement surface 424 is aligned with a corresponding second engagement surface 625, an intersection line between each second guide surface 624 and a second top surface is aligned with the corresponding first guide surface 421, and a first inner side surface and a first outer side surface are respectively aligned with a second inner side surface 622 and a second outer side surface 623 of the first groove 620, so as to position the bumps 420 and the first grooves 620. The holder 400 and the retaining ring 600 are respectively reversely rotated along a circumferential direction so that the first grooves 620 and the bumps 420 slide oppositely along the direction of the first engagement surface 424 (or the second engagement surface 625) for mutual clamping, which can prevent the retaining ring 600 from being detached from the holder 400.

In practice, the bumps 420 can be manufactured in a manner of being integrally formed with the holder 400, or, manufactured in a manner of being separated from the holder 400. The separation approach is disclosed in FIG. 10B and FIG. 10C.

Figure 11A:
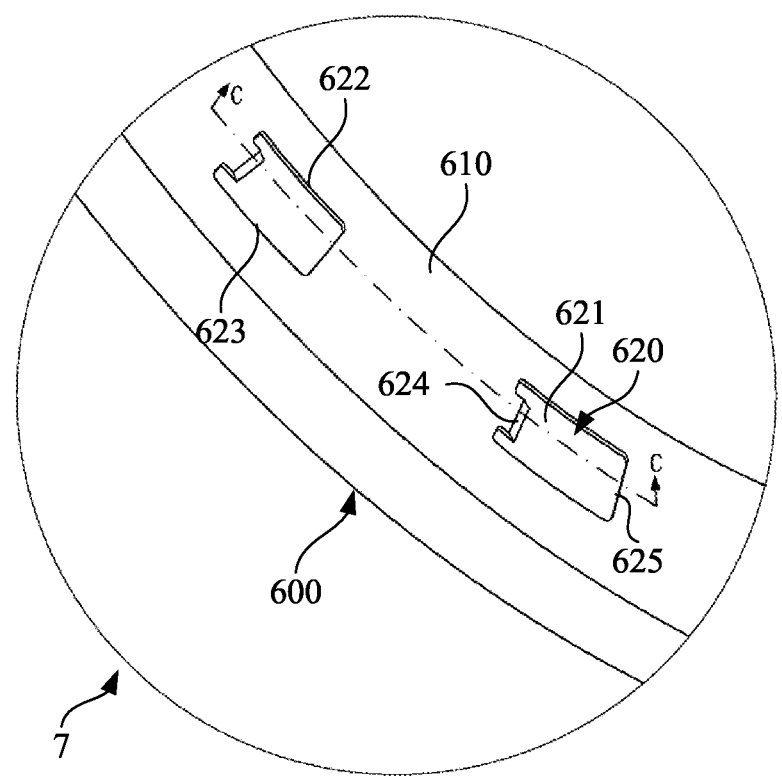
FIG. 11A and FIG. 11B are an enlarged view and a schematic sectional view of a part 7 of a retaining ring in the embodiment of FIG. 9A and FIG. 9B according to the present creation.
Figure 11B:
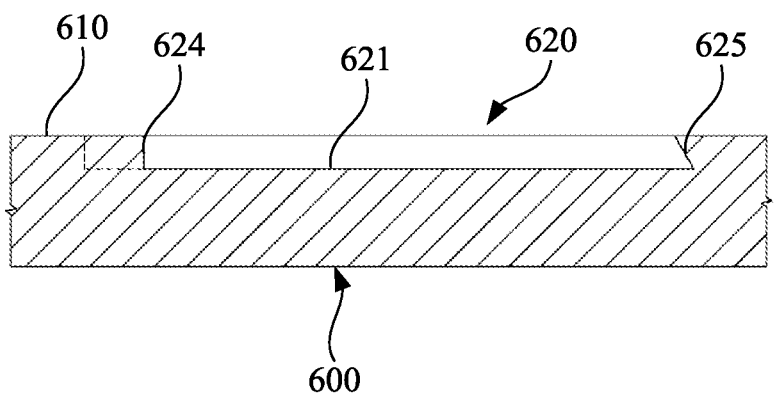

Next, referring to FIG. 11A and FIG. 11B, FIG. 11A and FIG. 11B are a partially enlarged view and a sectional view of the retaining ring 600. The retaining ring 600 has a second joint surface 610 and a plurality of first grooves 620, where the first grooves 620 are annularly arranged on the second joint surface 610 and used for providing the bumps 420 with an accommodation space, and providing a second engagement surface 625 (a nine-tail slot structure) for accommodating the first engagement surface 424 of the bumps 420. The second engagement surface 625 is a plane extending radially along the retaining ring 600, a root portion of the second engagement surface 625 inclining towards the second joint surface 610 to form a barb structure. As the first engagement surface 424 of the bump 420 forms a barb structure, the second engagement surface 625 forms another barb structure with the second joint surface 610, and is parallel to the first engagement surface 424.

In FIG. 11A, the structure of the first groove 620 consists of: a second top surface 621, a second inner side surface 622, a second outer side surface 623, a second guide surface 624 and a second engagement surface 625. The second top surface 621 is a plane and forms the bottom of the first groove 620. The second inner side surface 622 and the second outer side surface 623 are surfaces concave along a circumferential direction of the retaining ring 600, and a bending radius of the second inner side surface 622 is smaller than that of the second outer side surface 623. The second engagement surface 625 is preferably a plane extending radially along the retaining ring 600 (the present creation is not limited thereto), and a root portion (an intersection line with the second top surface 621) of the second engagement surface 625 inclines towards the second joint surface 610 to form a barb shape. In this embodiment, the second engagement surface 625 preferably matches the first engagement surface 424 to form the same inclined angle of 30 degrees, and the rest embodiments may use an angle between 1 degree to 60 degrees, and similarly, the second engagement surface 625 and the first engagement surface 424 have the same inclined angle and are parallel to each other. The second guide surface 624 is preferably a plane extending radially along the retaining ring 400 (the present creation is not limited thereto), and in this embodiment, preferably the root portion (an intersection line between the second guide surface 624 and the second joint surface 610) of the second guide surface 624 inclines towards an inner side of the bumps 4200.

In addition, in this embodiment, structures of the holder and the retaining ring can be reversed. The lateral perforations 500 may be disposed at the portion of metal parts, and also may be disposed at the portion of plastic parts.

Next, referring to FIG. 12A to FIG. 12D, FIG. 12A to FIG. 12D show embodiments of lateral perforation structures of the present invention being applied to another chemical mechanical polishing fixture. The holder 402 has a first joint surface 410; and the retaining ring 202 is made of high-order plastic materials, and has a second joint surface 610. The first joint surface 410 is annular, and two side walls 430 are preferably disposed in the annular shape above the first joint surface 410 and on an outer edge to form an annular slot 440. A plurality of bumps 420 is annularly arranged in the annular slot 440. Each bump 420 consists of five surfaces to be platform-like, including: a first top surface, a first inner side surface, a first outer side surface, a first engagement surface and a first guide surface, as shown in the embodiments of FIG. 10A to FIG. 10C and FIG. 12C.

The first top surface of the bump 420 is a plane and forms the top of the bump 420. The first inner side surface and the first outer side surface are curved surfaces extending along a circumferential direction of the retaining ring 402, and a bending radius of the first inner side surface is smaller than that of the first outer side surface. The first engagement surface is preferably a plane extending radially along the retaining ring 402 (the present creation is not limited thereto), and a root portion (an intersection line between the first engagement surface and the first joint surface) of the first engagement surface inclines towards an outer side of the bumps 420 to form a barb shape, and in this embodiment, the first engagement surface 625 preferably inclines at an angle of 30 degrees. The first guide surface is preferably a plane extending radially along the holder 402 (the present creation is not limited thereto), and matches the first engagement surface to guide the bumps 640 on the retaining ring 602 to clamp the bumps 420. In this embodiment, the first guide surface is preferably disposed perpendicular to the first joint surface, but also the root portion (an intersection line between the first guide surface and the first joint surface) may incline towards an inner side of the bump 420.

Figure 12A:
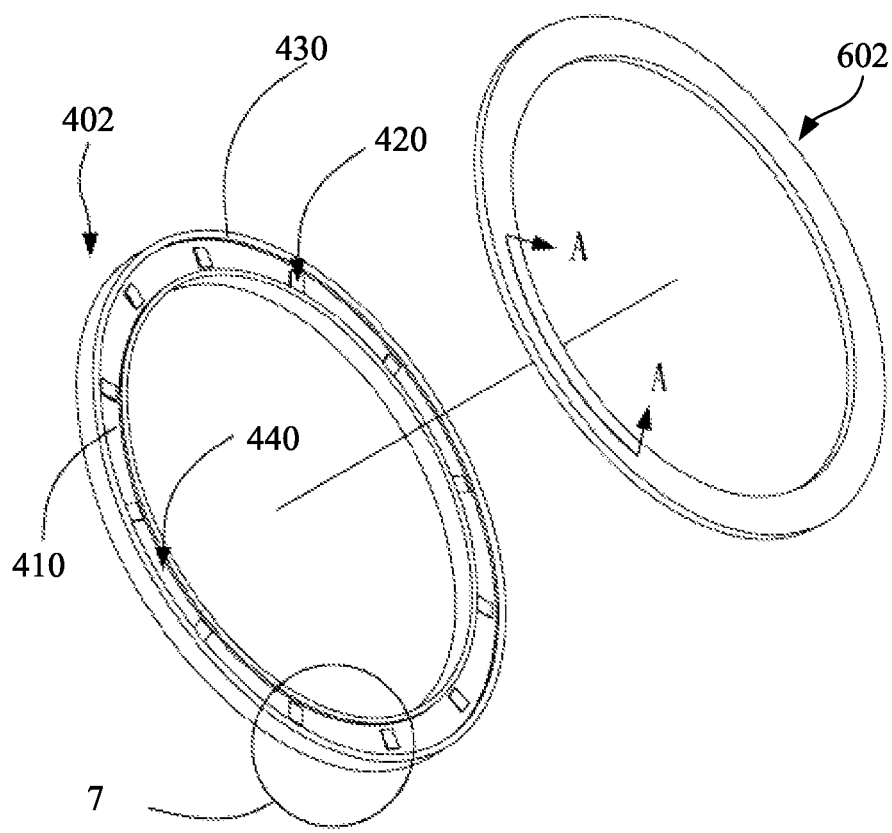
FIG. 12A to FIG. 12D are a structural embodiment of the present creation being applied to a further chemical mechanical polishing fixture.
Figure 12B:
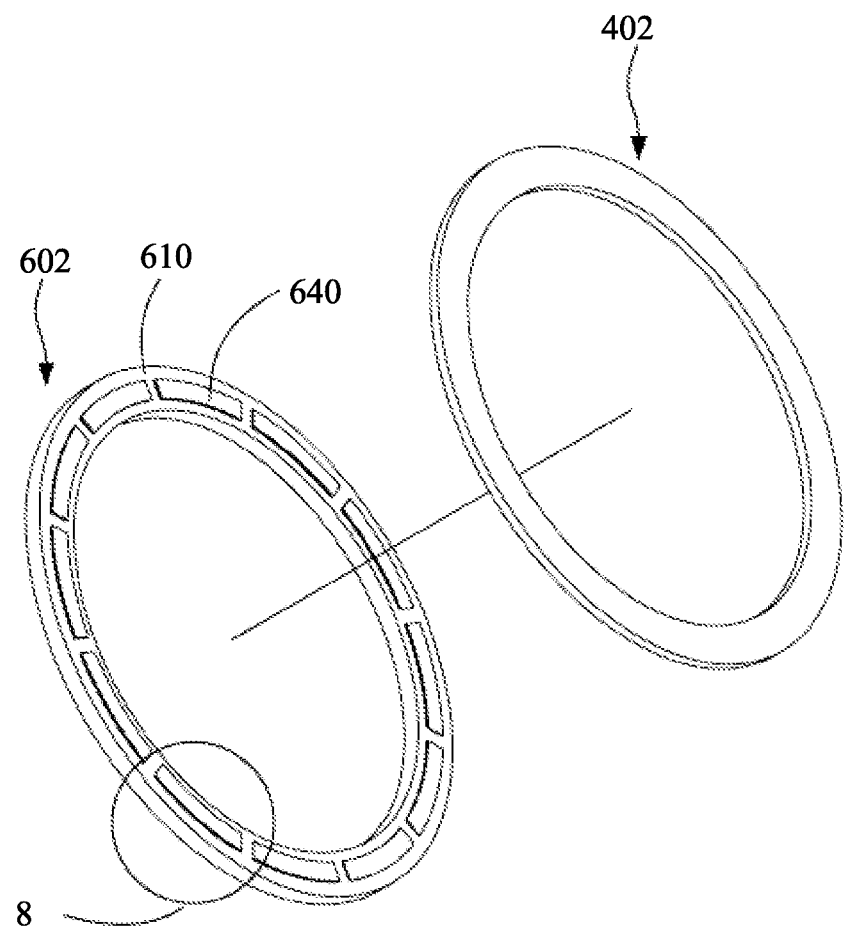
Figure 12C:
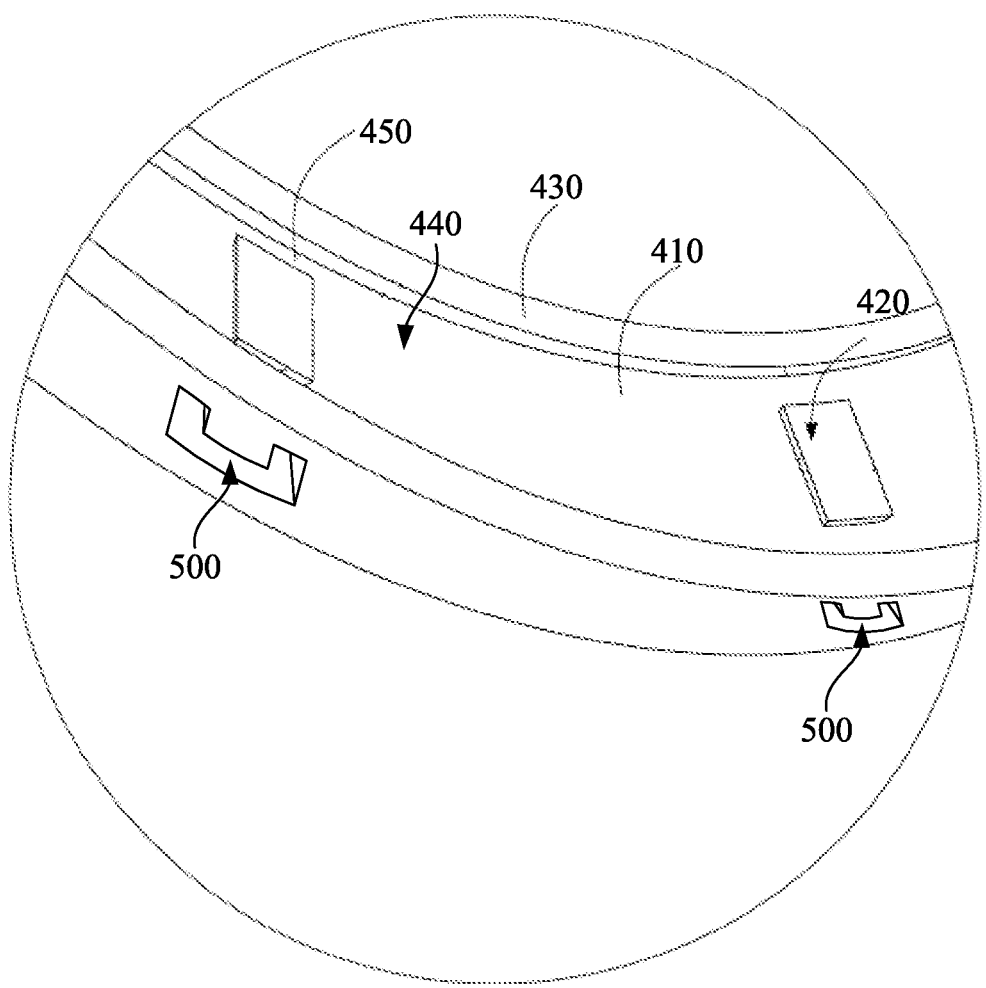

Referring to FIG. 12C, a gap is kept between each bump 420 (first bump) and a side wall 430 of the annular slot 440 to form an inclined-angle slot 450, which is continuously machined into a plurality of bumps 420.

Figure 12D:
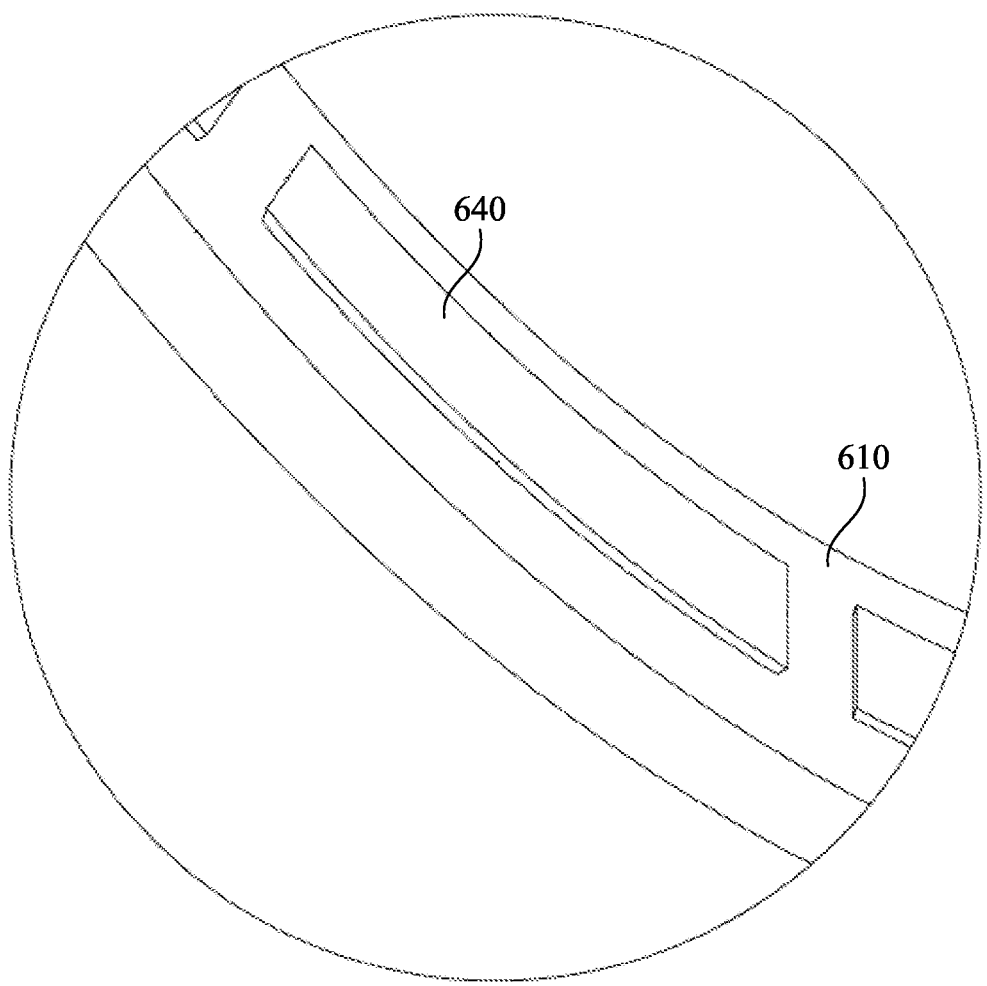

Referring to FIG. 12D, the bumps 640 (second bumps) are convexly disposed on the second joint surface 610 to clamp the corresponding bumps 420. In combination with FIG. 12C, in this embodiment, the second joint surface 610 is preferably convexly provided with a plurality of bumps 640 corresponding to the plurality of bumps 420, and each bump 640 consists of five surfaces to be platform-like, including: a second top surface, a second inner side surface, a second outer side surface, a second engagement surface and a second guide surface.

The second top surface is a plane and forms the top of the bumps 640. The second inner side surface and the second outer side surface are surfaces extending along a circumferential direction of the retaining ring 602, and a bending radius of the second inner side surface is smaller than that of the second outer side surface. The second engagement surface is preferably a plane extending radially along the retaining ring 602 (the present creation is not limited thereto), and a root portion (an intersection line between the second engagement surface and the second joint surface) of the second engagement surface inclines towards an outer side of the second bumps 640 to form a barb shape. In this embodiment, the second engagement surface preferably matches the first engagement surface of the bump 420 to form the same inclined angle of 30 degrees, the rest embodiments may use an angle between 1 degree to 60 degrees, and similarly, the second and first engagement surfaces have the same inclined angle and are parallel to each other. The second guide surface is preferably a plane extending radially along the retaining ring 602 (the present creation is not limited thereto), and in this embodiment, preferably the root portion (an intersection line between the second guide surface and the second joint surface) of the second guide surface inclines towards an inner side of the second bumps 640.

The embodiment of FIG. 12C describes that in the area 8 of FIG. 12B, the lateral perforations 500 are formed below the bumps 420. The converse U-shaped cube structures can reduce the metal volume of the holder 400, thereby reducing the weight of the holder 400. Other lateral perforation structures also may be configured in manners similar to those in FIG. 10A to FIG. 10C, or, be configured on two sides of the bumps 420.

In addition, in this embodiment, structures of the holder and the retaining ring can be reversed. The lateral perforations 500 may be disposed at the portion of metal parts, and also may be disposed at the portion of plastic parts.

Figure 13A:
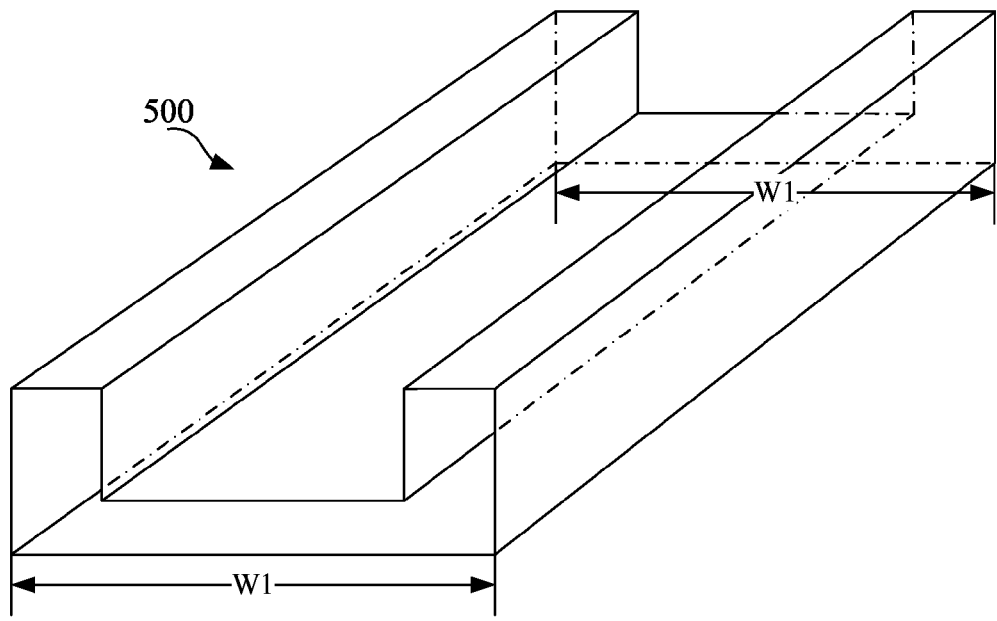
FIG. 13A and FIG. 13B are schematic three-dimensional views of different structures of a lateral perforation 500 according to the present creation.
Figure 13B:
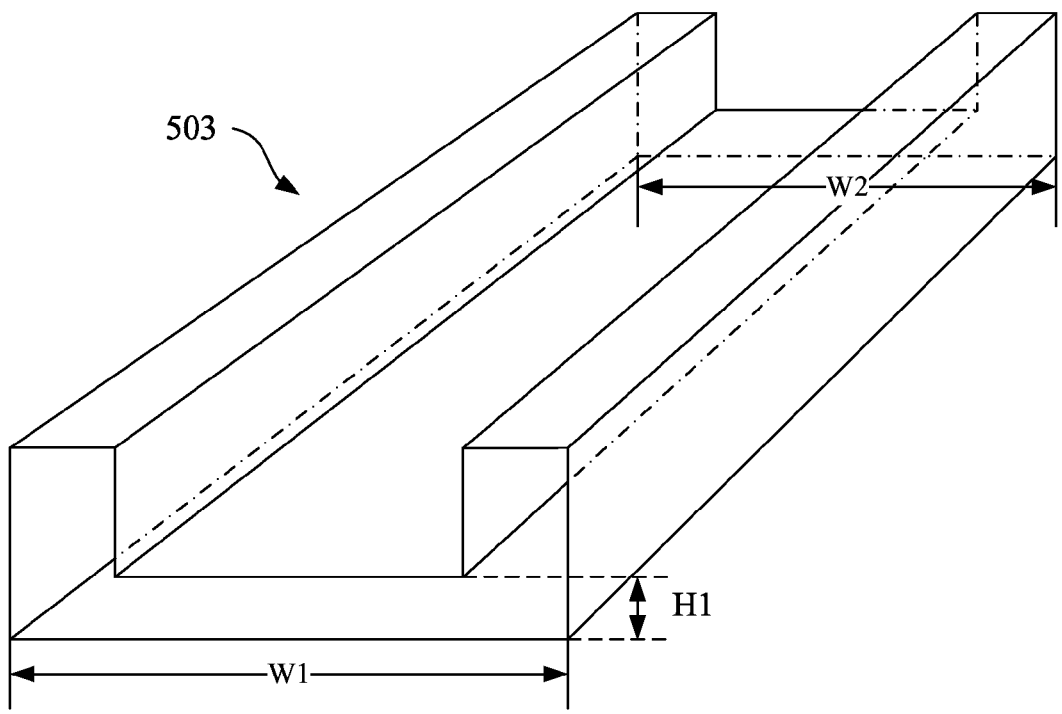

In practice, the lateral perforations 500 may adopt different structures, and for example, FIG. 13A and FIG. 13B are schematic three-dimensional views of different structures of the lateral perforations 500 according to the present creation. FIG. 13A shows that the lateral perforations 500 use the same width W1 from front to back to manufacture the converse U-shaped cube structure, which may correspond to the embodiments in FIG. 2B and FIG. 2D; FIG. 13B shows that the lateral perforations 503 use different widths W1 and W2 to manufacture the converse U-shaped cube structure, which may correspond to the embodiments in FIG. 2E and FIG. 2F.

Figure 13C:
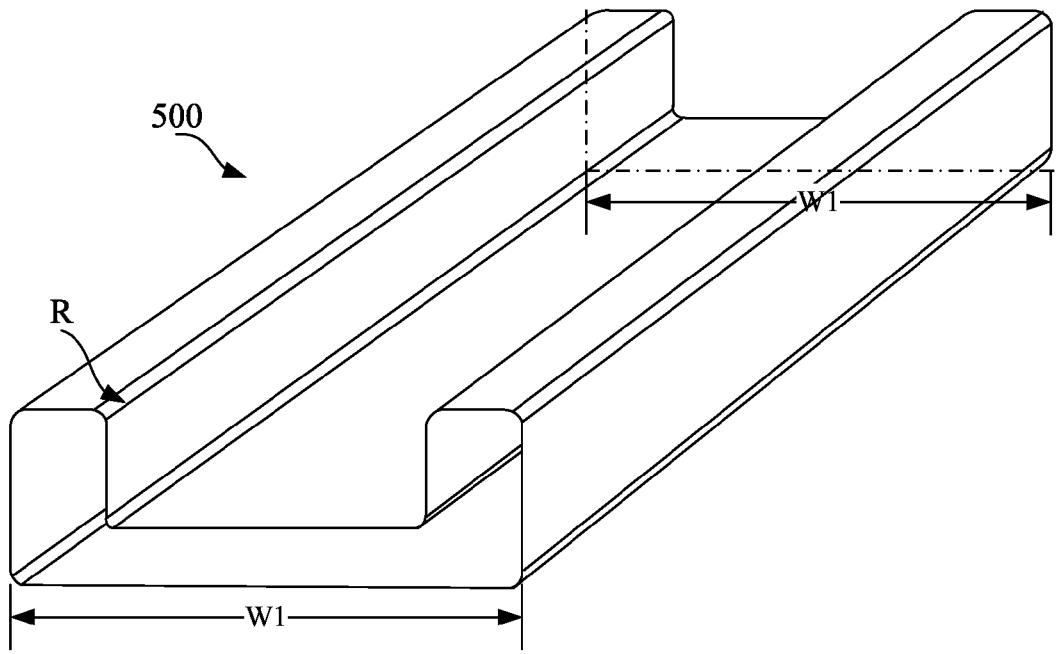
FIG. 13C and FIG. 13D are schematic three-dimensional views that internal bending angles are an angle R and an angle C respectively in the embodiment of FIG. 13A.
Figure 13D:
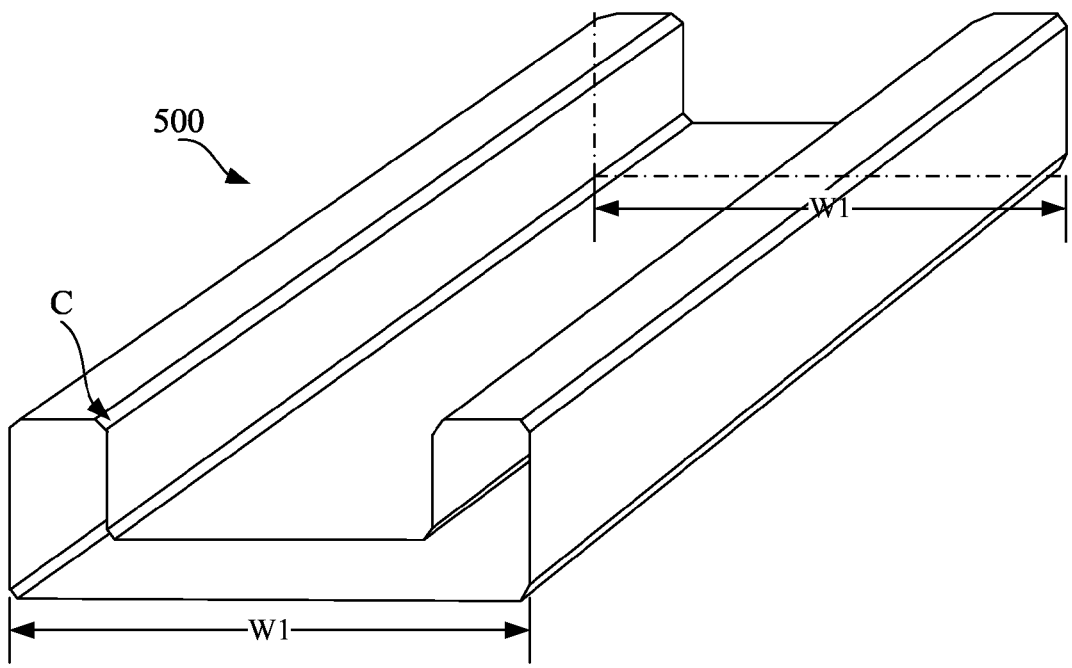
Figure 14A:
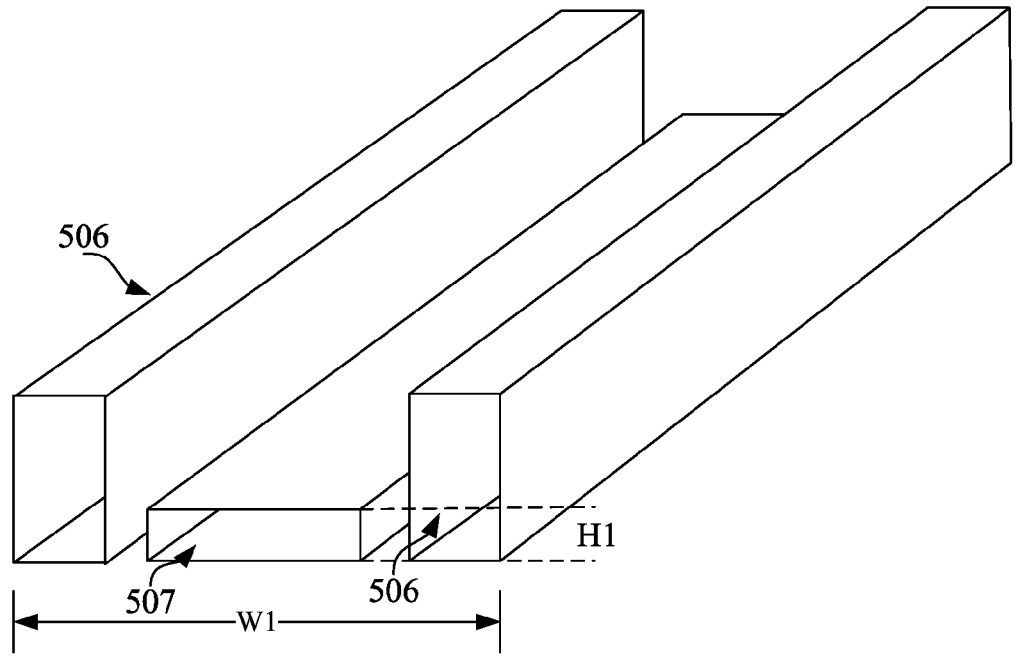
FIG. 14A to FIG. 14C are schematic three-dimensional views of other different structures of a lateral perforation 500 according to the present creation.
Figure 14B:
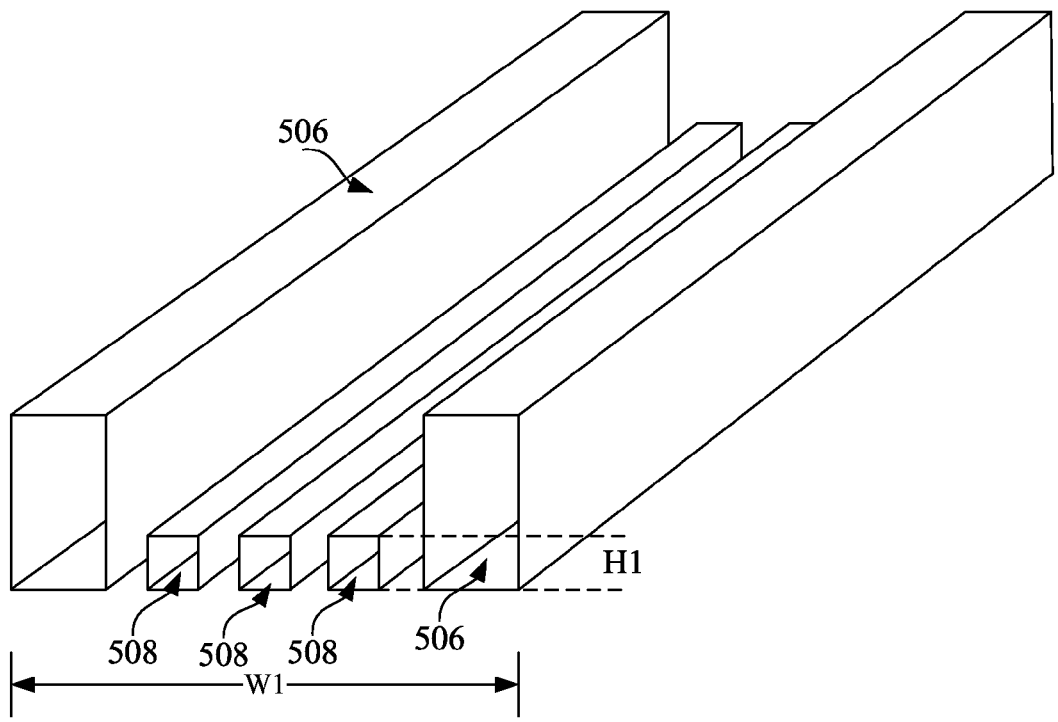
Figure 14C:
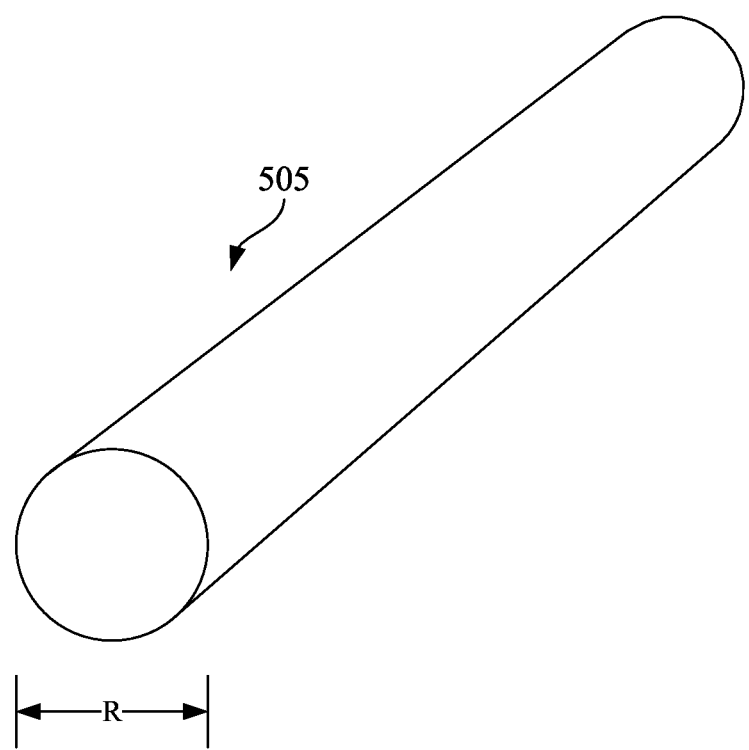

Next, referring to FIG. 13C and FIG. 13D, during manufacturing, the lateral perforations 500 may form an angle R as in FIG. 13C at an internal bending position, which may be formed in a drilling process. Alternatively, an angle C as in FIG. 13C is formed at an internal bending position, which also may be formed in a drilling process. The angle R and the angle C may prevent a chemical polishing slurry from accumulating during perfusion to increase resistance of following perfusion of the chemical polishing slurry to the lateral perforations 500 and prevent the process from becoming less stable. FIG. 14A and FIG. 14B are schematic three-dimensional views of other different structures of the lateral perforations 500 according to the present creation. In the embodiments, in the form, a plurality of different three-dimensional structures makes up a converse U-shaped cube structure. In the embodiment of FIG. 14A, the lateral perforations are jointly made up of a pair of cuboid structures 506 and a flat cuboid structure 507. In the embodiment of FIG. 14B, the lateral perforations are jointly made up of a pair of cuboid structures 506 and three cube structures 508. In the embodiment of FIG. 14C, the lateral perforations are made up of a cylinder structure 505, whose diameter is R.

Figure 15A:
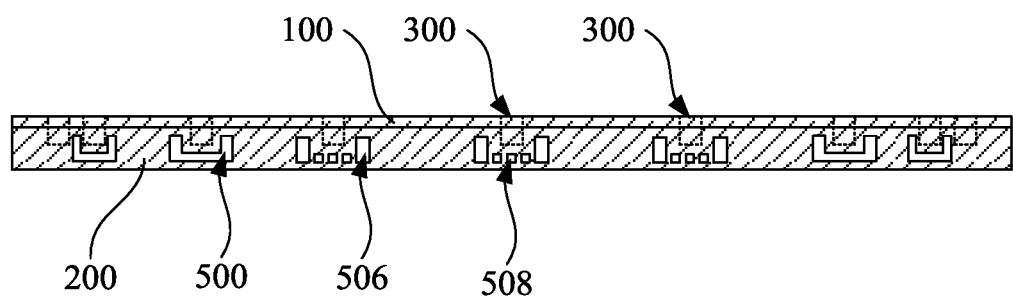
FIG. 15A to FIG. 15C are schematic sectional views of configuration of different lateral perforation structures of a chemical polishing retaining ring according to the present creation.
Figure 15B:
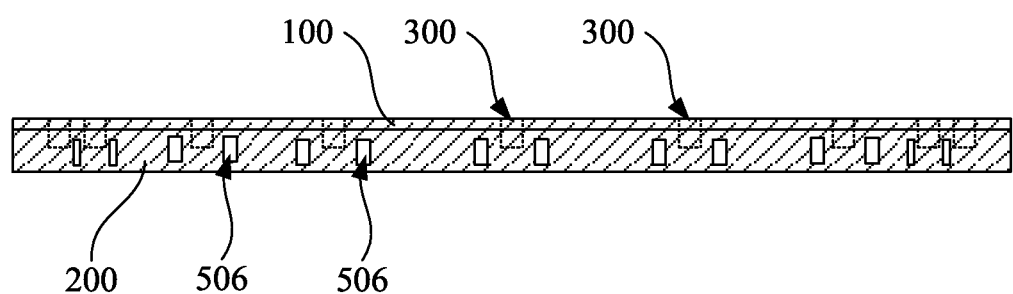
Figure 15C:
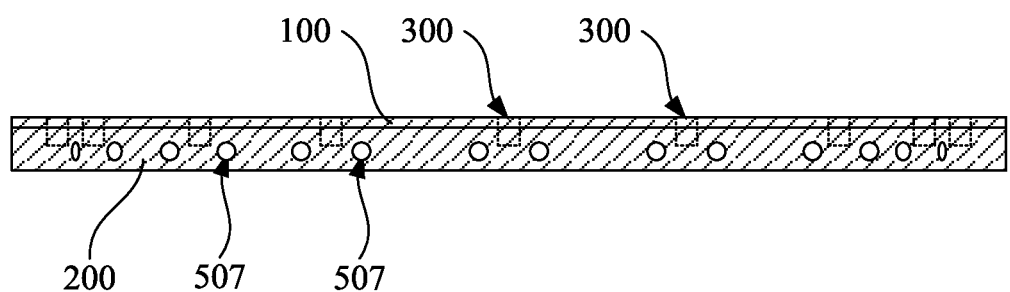

FIG. 15A to FIG. 15C are schematic sectional views of configuration of different lateral perforation structures of a chemical polishing retaining ring according to the present creation, in which different lateral perforation structures in FIG. 13A to FIG. 14C are mixed. The embodiment of FIG. 15A is formed by the lateral perforation 500 of FIG. 13A and the lateral perforation structure of FIG. 14B. In the embodiment of FIG. 15B, the cuboid structures 506 serve as lateral perforation structures and are disposed on two sides of the bushing screws 300. In the embodiment of FIG. 15C, the cylinder structures 505 form lateral perforations, which are also disposed on two sides of the bushing screws 300.

In addition, in the embodiments where the bushing screws 300 are applied, as the holder has a second inner thread structure for locking a semiconductor machine, the chemical mechanical polishing fixture can achieve the purpose of having light weight and low cost through the design of the retaining ring.

Figure 16A:
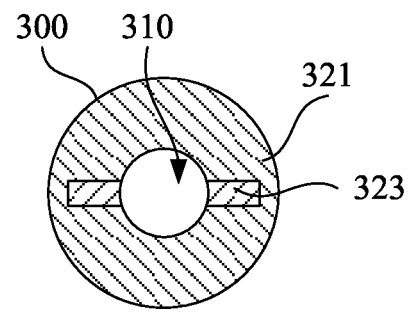
FIG. 16A to FIG. 16C are top views of different embodiments of bushing screws according to the present creation.
Figure 16B:
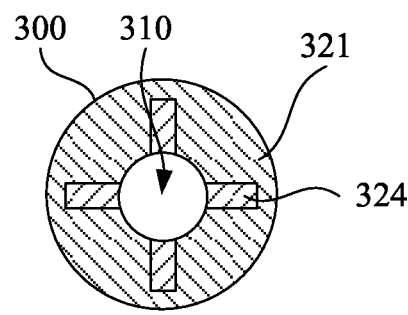
Figure 16C:
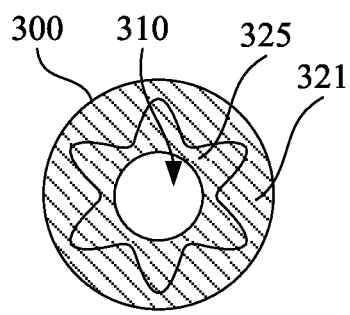

Besides, the concave locking structure for the locking tool (screwdriver) to perform locking, in addition to the hexagonal design, also may adopt other different structures. Referring to FIG. 16A to FIG. 16C, FIG. 16A to FIG. 16C are top views of multiple embodiments of bushing screws according to the present creation, and describe respectively that the top surface 321 of the screw head 320 of the bushing screw 300 has a concave locking structure, respectively being a flat shape locking structure 323, a cross locking structure 324 or a star locking structure 325.

Figure 17A:
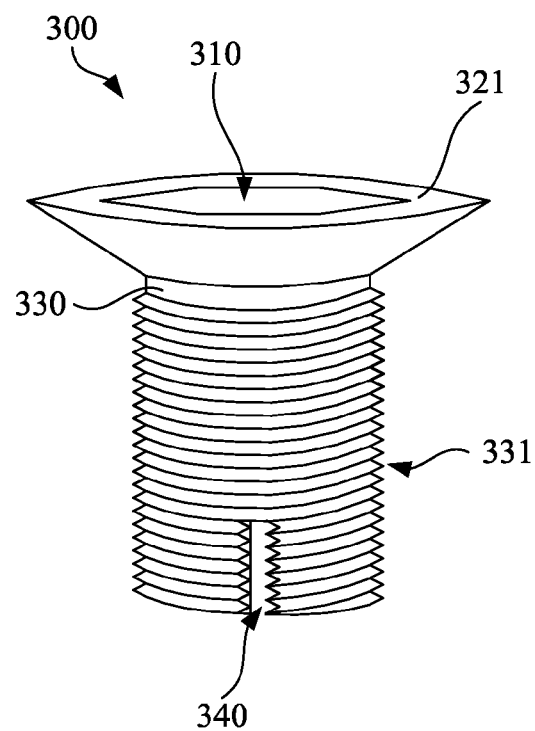
FIG. 17A and FIG. 17B are three-dimensional views of another embodiment of the bushing screw according to the present creation.
Figure 17B:
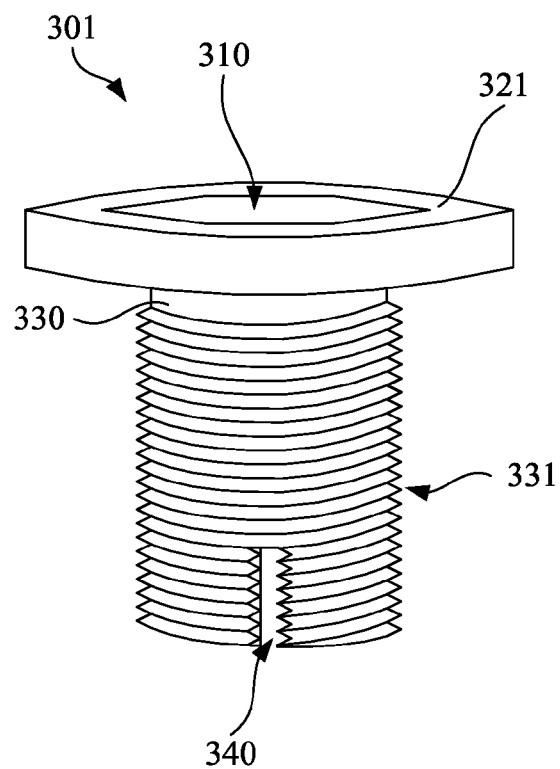

In addition, the bushing screws 300 also have many different designs. For example, referring to FIG. 17A and FIG. 17B, FIG. 17A and FIG. 17B are two embodiments of the bushing screws according to the present creation. In the two embodiments, the bushing screws 300 and 301 are respectively designs of a screw head of a flat structure and a screw head of a countersunk structure, and they both increase the design of a tapping gap 340, which is disposed at the bottom of the screw rod 330, for making the bushing screws 300 easily locked.

Compared with that a planar bonding plane is directly bonded in the prior art, the chemical mechanical polishing fixture of the present creation can more effectively fix the retaining ring and the holder, so as to extend the service life of the chemical mechanical polishing fixture. In addition, the chemical mechanical polishing fixture of the present creation can, while achieving the effect of maintaining the strength provided by the retaining ring, also achieve the efficacy of strength and weight reduction by applying light weight plastic substrate of the holder. More importantly, with the design of the present creation, the chemical mechanical polishing fixture can have multiple effects such as easy assembly, low production cost, low maintenance cost, and high scalability. Therefore, different combinations can be easily adjusted through the requirements for weight.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A chemical mechanical polishing fixture having lateral perforation structures, comprising:
    a holder, comprising:
        an annular substrate having a first joint surface, an outer periphery and an inner periphery;
        a plurality of first holes annularly arranged on the first joint surface, each first hole comprising a first inner thread structure; and
        a plurality of lateral perforation structures penetrating from the outer periphery to the inner periphery of the annular substrate, wherein the lateral perforations are selected from: a converse U-shaped cube structure, a cuboid structure, a cylinder structure, an elliptic cylinder structure, a flat cuboid structure or a hybrid structure of at least one cuboid structure and the above;
    a retaining ring having a second joint surface and a plurality of second holes, wherein the second holes are annularly arranged on the second joint surface, and each second hole corresponds to one first hole; and
    a plurality of bushing screws, each having a screw head, a hollow structure and a screw rod, wherein an inner wall surface of the screw rod has a second inner thread structure, an outer wall surface of the screw rod has an outer thread structure, each bushing screw penetrates the second holes of the retaining ring and the first holes of the holder, and then is locked to the first inner thread structure via the outer thread structure to fix the holder and the retaining ring, so that the first joint surface and the second joint surface are joined closely, and the second inner thread structure is used for locking the chemical mechanical polishing fixture having lateral perforation structures to a semiconductor machine individually with a setscrew.

2. The chemical mechanical polishing fixture having lateral perforation structures according to claim 1, wherein the bushing screw further comprises:
    a tapping gap extending from the bottom of the screw rod to the screw head, and used for making the bushing screw easily locked.

3. The chemical mechanical polishing fixture having lateral perforation structures according to claim 1, wherein the lateral perforation structures have an angle R or an angle C at a bending position.

4. The chemical mechanical polishing fixture having lateral perforation structures according to claim 1, wherein an inclined angle of 60 degrees to 120 degrees is formed between the lateral perforation structures and the outer periphery of the annular substrate.

5. A chemical mechanical polishing fixture having lateral perforation structures, comprising:
    a holder, comprising:
        an annular substrate having a first joint surface, an outer periphery and an inner periphery;
        a plurality of holes annularly arranged on the first joint surface, each hole comprising a first inner thread structure; and
        a plurality of lateral perforation structures penetrating from the outer periphery to the inner periphery of the annular substrate, wherein the lateral perforations are selected from: a converse U-shaped cube structure, a cuboid structure, a cylinder structure, an elliptic cylinder structure, a flat cuboid structure or a hybrid structure of at least one cuboid structure and the above; and
    a plurality of bushing screws, each having a screw head, a hollow structure and a screw rod, wherein an inner wall surface of the screw rod has a second inner thread structure, an outer wall surface of the screw rod has an outer thread structure, each bushing screw penetrates the third-holes of the holder, and then is locked to the first inner thread structure via the outer thread structure to be fixed to the holder, and the second inner thread structure is used for locking the first joint surface to a semiconductor machine by the chemical mechanical polishing fixture having lateral perforation structures individually with a setscrew.

6. The chemical mechanical polishing fixture having lateral perforation structures according to claim 5, wherein the bushing screw further comprises:
    a tapping gap extending from the bottom of the screw rod to the screw head, and used for making the bushing screw easily locked.

7. The chemical mechanical polishing fixture having lateral perforation structures according to claim 5, wherein the lateral perforation structures have an angle R or an angle C at a bending position.

8. The chemical mechanical polishing fixture having lateral perforation structures according to claim 5, wherein an inclined angle of 60 degrees to 120 degrees is formed between the lateral perforation structures and the outer periphery of the annular substrate.

9. A chemical mechanical polishing fixture having lateral perforation structures, comprising:
    a holder, comprising:
        an annular substrate having a first joint surface, an outer periphery and an inner periphery;
        a plurality of holes annularly arranged on the first joint surface, each hole comprising a first inner thread structure for individually providing a screw to be locked to a semiconductor machine; and
        a plurality of lateral perforation structures penetrating from the outer periphery to the inner periphery of the annular substrate, wherein the lateral perforations are selected from: a converse U-shaped cube structure, a cuboid structure, a cylinder structure, an elliptic cylinder structure, a flat cuboid structure or a hybrid structure of at least one cuboid structure and the above.

10. The chemical mechanical polishing fixture having lateral perforation structures according to claim 9, wherein the lateral perforation structures are the converse U-shaped cube structure, and the converse U-shaped cube structure is configured below the holes.

11. The chemical mechanical polishing fixture having lateral perforation structures according to claim 9, wherein the lateral perforation structures have an angle R or an angle C at a bending position.

12. The chemical mechanical polishing fixture having lateral perforation structures according to claim 9, wherein an inclined angle of 60 degrees to 120 degrees is formed between the lateral perforation structures and the outer periphery of the annular substrate.

13. A chemical mechanical polishing fixture having lateral perforation structures, comprising:
   a holder, comprising:
      an annular substrate having a first joint surface, an outer periphery and an inner periphery;
      a plurality of bumps annularly arranged on the first joint surface, each bump comprising:
         a first engagement surface, which is a plane extending radially along the annular substrate, a root portion of the first engagement surface inclining towards an outer side of the bump to form a barb structure; and
         a plurality of lateral perforation structures penetrating from the outer periphery to the inner periphery of the annular substrate, wherein the lateral perforations are selected from: a converse U-shaped cube structure, a cuboid structure, a cylinder structure, an elliptic cylinder structure, a flat cuboid structure or a hybrid structure of at least one cuboid structure and the above; and
   a retaining ring having a second joint surface and a plurality of first grooves, wherein the first grooves are annularly arranged on the second joint surface, and each first groove comprises:
      a second engagement surface, which is a plane extending radially along the retaining ring, a root portion of the second engagement surface inclining towards the second joint surface to form a barb structure;
   wherein the holder and the retaining ring are axially aligned, so that the first joint surface is aligned with the second joint surface, the bumps are aligned with the first grooves, and the holder and the retaining ring respectively reversely rotate along a circumferential direction to engage the first engagement surface of the bump with the second engagement surface of the first groove.

14. The chemical mechanical polishing fixture having lateral perforation structures according to claim 13, wherein the bump further comprises: a first guide surface disposed opposite the first engagement surface, and inclining towards an outer side of the bump from a root portion of the first engagement surface along a radially extending plane of the annular substrate.

15. The chemical mechanical polishing fixture having lateral perforation structures according to claim 13, wherein the first groove further comprises: a second guide surface disposed opposite the second engagement surface, inclining towards an outer side of the bump from a root portion of the first engagement surface along a radially extending plane of the annular substrate, and parallel to the second engagement surface.

16. The chemical mechanical polishing fixture having lateral perforation structures according to claim 13, wherein the lateral perforation structures have an angle R or an angle C at a bending position.

17. The chemical mechanical polishing fixture having lateral perforation structures according to claim 13, wherein an inclined angle of 60 degrees to 120 degrees is formed between the lateral perforation structures and the outer periphery of the annular substrate.

18. A chemical mechanical polishing fixture having lateral perforation structures, comprising:
   a retaining ring, comprising:
      an annular substrate having a first joint surface; and
      a plurality of bumps annularly arranged on the first joint surface, each bump comprising:
         a first engagement surface, which is a plane extending radially along the annular substrate, a root portion of the first engagement surface inclining towards an outer side of the bump to form a barb structure; and
   a holder having an annular structure, a second joint surface and a plurality of first grooves, wherein the annular structure has an outer periphery and an inner periphery, the first grooves are annularly arranged on the second joint surface, and each first groove comprises:
      a second engagement surface, which is a plane extending radially along the holder, a root portion of the second engagement surface inclining towards the second joint surface to form a barb structure; and
      a plurality of lateral perforation structures, penetrating from the outer periphery to the inner periphery of the annular structure, wherein the lateral perforations are selected from: a converse U-shaped cube structure, a cuboid structure, a cylinder structure, an elliptic cylinder structure, a flat cuboid structure or a hybrid structure of at least one cuboid structure and the above;
   wherein the holder and the retaining ring are axially aligned, so that the first joint surface is aligned with the second joint surface, the bumps are aligned with the first grooves, and the holder and the retaining ring respectively reversely rotate along a circumferential direction to engage the first engagement surface of the bump with the second engagement surface of the first groove.

19. The chemical mechanical polishing fixture having lateral perforation structures according to claim 18, wherein the bump further comprises: a first guide surface disposed opposite the first engagement surface, and inclining towards an outer side of the bump from a root portion of the first engagement surface along a radially extending plane of the annular substrate.

20. The chemical mechanical polishing fixture having lateral perforation structures according to claim 19, wherein the first groove further comprises: a second guide surface disposed opposite the second engagement surface, inclining towards an outer side of the bump from a root portion of the first engagement surface along a radially extending plane of the annular substrate, and parallel to the second engagement surface.

21. The chemical mechanical polishing fixture having lateral perforation structures according to claim 18, wherein the lateral perforation structures have an angle R or an angle C at a bending position.

22. The chemical mechanical polishing fixture having lateral perforation structures according to claim 18, wherein an inclined angle of 60 degrees to 120 degrees is formed between the lateral perforation structures and the outer periphery of the annular substrate.

* * * * *